(12) United States Patent
Dsaak et al.

(10) Patent No.: US 12,181,075 B2
(45) Date of Patent: Dec. 31, 2024

(54) VALVE ASSEMBLY, VACUUM ASSEMBLY AND METHOD

(71) Applicant: VON ARDENNE Asset GmbH & Co. KG, Dresden (DE)

(72) Inventors: Torsten Dsaak, Dresden (DE); Michael Hofmann, Dresden (DE); Thomas Meyer, Dresden (DE)

(73) Assignee: VON ARDENNE Asset GmbH & Co. KG, Dresden (DE)

( * ) Notice: Subject to any disclaimer, the term of this patent is extended or adjusted under 35 U.S.C. 154(b) by 958 days.

(21) Appl. No.: 17/016,437

(22) Filed: Sep. 10, 2020

(65) Prior Publication Data

US 2021/0080028 A1    Mar. 18, 2021

(30) Foreign Application Priority Data

Sep. 12, 2019    (DE) ...................... 10 2019 124 484.6

(51) Int. Cl.
| | | |
|---|---|---|
| *F16K 51/02* | (2006.01) | |
| *B65G 47/91* | (2006.01) | |
| *F16K 3/36* | (2006.01) | |
| *F16K 13/02* | (2006.01) | |

(52) U.S. Cl.
CPC .............. *F16K 51/02* (2013.01); *B65G 47/91* (2013.01); *F16K 3/36* (2013.01); *F16K 13/02* (2013.01)

(58) Field of Classification Search
CPC ... F16K 3/36; F16K 3/22; F16K 51/02; F16K 13/02; H01L 21/67126; B65G 47/91
See application file for complete search history.

(56) References Cited

U.S. PATENT DOCUMENTS

| | | | | |
|---|---|---|---|---|
| 3,342,453 | A  * | 9/1967 | Soila ....................... | F16K 5/185 251/188 |
| 2006/0182534 | A1* | 8/2006 | Hiroki ............... | H01L 21/67126 414/217 |
| 2009/0016855 | A1* | 1/2009 | Hofmeister ......... | H01L 21/6719 414/220 |
| 2011/0186761 | A1* | 8/2011 | Huang ..................... | F16K 1/16 251/301 |

FOREIGN PATENT DOCUMENTS

| | | |
|---|---|---|
| DE | 102015116965 A1 | 4/2017 |
| DE | 102016107830 A1 | 11/2017 |

OTHER PUBLICATIONS

German Office Action issued for the corresponding DE application No. 10 2019 124 484.6, dated May 11, 2020, 6 pages (for informational purpose only).

* cited by examiner

*Primary Examiner* — Yuechuan Yu
(74) *Attorney, Agent, or Firm* — VIERING, JENTSCHURA & PARTNER MBB

(57) ABSTRACT

According to various aspects of the disclosure, a valve assembly for a vacuum chamber housing may have: a valve housing, which has a substrate transfer gap; a valve flap, which is mounted so as to be rotatable about an axis of rotation, thus enabling said flap to be rotated into a first position and into a second position, wherein the axis of rotation is arranged in the substrate transfer gap, and wherein the substrate transfer gap is extended longitudinally along the axis of rotation; wherein the valve flap closes the substrate transfer gap in the first position and is arranged adjacent to the substrate transfer gap in the second position.

19 Claims, 15 Drawing Sheets

VALVE ASSEMBLY, VACUUM ASSEMBLY AND METHOD

CROSS-CITING TO RELATED APPLICATIONS

This application claims priority to German Application 10 2019 124 484.6, which was filed on Sep. 12, 2019, the entirety of which is incorporated herein fully by reference.

TECHNICAL FIELD

Various illustrative embodiments relate to a valve assembly, to a vacuum assembly and to a method.

BACKGROUND

In general, a processing installation may be used to process a substrate, e.g. to machine, coat, heat, etch and/or structurally modify a substrate. Processing a substrate may take place in a chamber of a processing installation, for example, wherein the chamber may be configured in such a way that the conditions (process conditions) required for processing may be made available within the chamber. For this purpose, it may be necessary or helpful to seal off the chamber and/or further chambers of the processing installation from one another or from the environment of the processing installation.

Various chambers of a processing installation may be separated from one another by what are referred to as chamber walls or partition walls, e.g., in the case of horizontal continuous coating installations (in-line installations), by means of vertical chamber walls or vertical partition walls. In this case, each chamber wall may have a substrate transfer opening, such that a substrate may be transferred through the chamber wall, e.g. from a first chamber of a processing installation to a second chamber of a processing installation. Furthermore, the processing installation may have a substrate transfer opening in an inlet region and/or outlet region, such that a substrate may be introduced into the processing installation and/or removed from the processing installation.

To seal off various chambers of the processing installation from one another or to seal off a chamber of the processing installation from the environment, a substrate transfer opening of the respective chamber may be closed and/or sealed off by means of a valve.

A conventional valve may be configured as a flap valve, for example, wherein a valve flap of a flap valve is configured to be movable or to be pivotable about a pivoting axis to seal off the substrate transfer opening of a chamber. A valve flap of this kind rests against the outside of the chamber wall and covers the substrate transfer opening. To expose the substrate transfer opening, the valve flap must be pivoted away from the chamber wall. Hinge joints, pivot arms and the like are used here as bearings. In this case, the pivoting region of the valve flap must be kept free from internal chamber fittings, increasing the space requirement and making design more difficult. If a vacuum installation is to be retrofitted with a flap valve of this kind, it is therefore often necessary to arrange the flap valve and a mechanism thereof in a separate chamber, and this likewise increases the space requirement. It may be necessary, for example, to arrange additional transfer rollers below the pivoting region to prevent the formation of an excessively large gap between the transfer rollers, which would increase the risk of the substrate breaking.

SUMMARY

According to various aspects of the disclosure, it has been recognized that the space requirement for a valve may be reduced by departing from the conventional configuration, according to which the valve flap rests against the outside of the chamber wall. According to various aspects of the disclosure, in contrast, a configuration is provided according to which the valve flap is arranged within the substrate transfer opening and is rotated around an axis of rotation within the substrate transfer opening.

This enables the flap valve, together with the mechanism, to be made so compact that it may be retrofitted easily, even in an existing vacuum installation, without having to greatly modify said installation. For example, the distance between the transfer rollers directly adjacent to the substrate transfer opening is increased only insignificantly.

According to various aspects of the disclosure, a valve assembly for a vacuum chamber housing may have: a valve housing, which has a substrate transfer gap; a valve flap, which is mounted so as to be rotatable about an axis of rotation, thus enabling said flap to be rotated into a first position and into a second position, wherein the axis of rotation is arranged in the substrate transfer gap, and wherein the substrate transfer gap is extended longitudinally along the axis of rotation; wherein the valve flap closes the substrate transfer gap in the first position and is arranged adjacent to the substrate transfer gap in the second position.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed aspect of the disclosure. In the following description, various aspects of the disclosure are described with reference to the following drawings, in which.

DETAILED DESCRIPTION

Figure 1A:
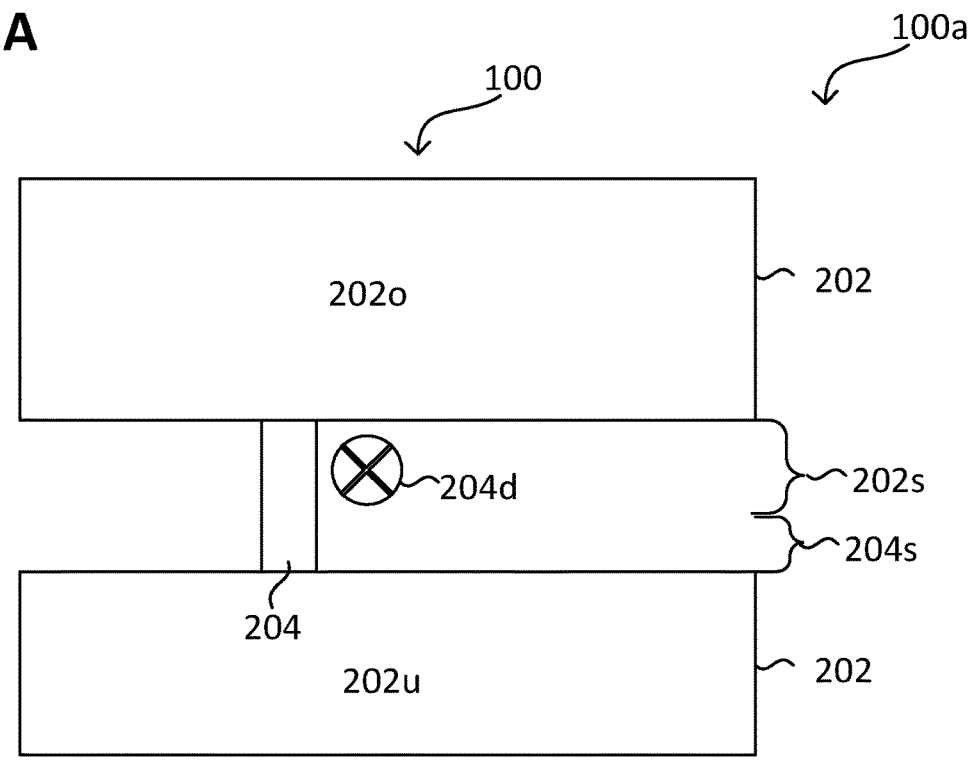
FIGS. 1A to 3B each show a valve assembly according to various aspects of the disclosure in various schematic side views or cross-sectional views.

In the following detailed description, reference is made to the attached drawings, which form part of said description and in which specific aspects of the disclosure in which the disclosure may be implemented are shown for the purpose of illustration. In this regard, directional terminology such as "top", "bottom", "forward", "rearward", "front", "rear" etc. are used with reference to the orientation of the figure(s) described. Since components of aspects of the disclosure may be positioned in a number of different orientations, the directional terminology is used for illustration purposes and is in no way restrictive. It is self-evident that other aspects of the disclosure may be used and that structural or logical changes may be performed without departing from the scope of protection of the present disclosure. It is self-evident that the features of the various illustrative aspects of the disclosure described herein may be combined with one another, unless specifically stated otherwise. The following detailed description is therefore not to be interpreted in a restrictive sense, and the scope of protection of the present disclosure is defined by the attached claims.

In the context of this description, the terms "connected", "attached" and "coupled" are used to describe both direct and indirect connection (e.g. ohmically and/or electrically conductive, e.g. electrically conductive connection), direct or indirect attachment, and direct or indirect coupling. In the figures, identical or similar elements are provided with identical reference signs where expedient.

According to various aspects of the disclosure, the term "coupled" or "coupling" may be interpreted in the sense of a (e.g. mechanical, fluid-conveying, hydrostatic, thermal and/or electrical), e.g. direct or indirect, connection and/or interaction. For example, several elements may be coupled to one another along a chain of interaction along which the interaction (e.g. a fluid) may be transmitted. It is possible, for example, for two elements that are coupled to one another to enter into an interactive exchange with one another, e.g. a mechanical, hydrostatic, thermal and/or electrical interaction. According to various aspects of the disclosure, "coupled" may be interpreted in the sense of mechanical (e.g. corporeal or physical) coupling, e.g. by means of direct physical contact. A coupling may be configured to transmit a mechanical interaction (e.g. force, torque etc.). A plurality of vacuum chambers may be connected to one another by means of what are referred to as substrate transfer openings, with the result that they form a common vacuum system, for example. The vacuum system may be closed in a substantially airtight manner with respect to the outside, e.g. by means of valves, chamber covers, seals and the like. The vacuum system may have a plurality of vacuum pumps, which may remove gas from the vacuum chambers, thus enabling a vacuum to be formed in said chambers. Different regions of a vacuum system may be sealed off from one another, and/or the interior of the vacuum chambers may be sealed off from the atmosphere. In various configurations, the substrate transfer opening is restricted to a substrate transfer gap, in order to provide gas separation for example. This may be accomplished, for example, by means of a frame (e.g. a plate) which has the substrate transfer gap, or by means of a valve assembly described herein.

According to various aspects of the disclosure, sealing may include inhibiting mass transfer (e.g. gas exchange) through the sealed location. For example, a fluid-conveying connection (e.g. a gap) may be interrupted by means of sealing, thus ensuring that two regions of the interrupted connection are gas-separated from one another, e.g. by means of a seal arranged between them. The two regions may differ from one another in their pressure, i.e. they may have a pressure difference. The fluid-conveying connection may be part of the vacuum system, for example, with the result that two vacuum system regions are formed, in each of which a vacuum may be formed.

In general, a vacuum chamber housing may have one or more than one vacuum chamber. The vacuum chambers of mutually adjoining vacuum chamber housings may be separated from one another by means of what are referred to as housing walls, and mutually adjoining vacuum chambers within the vacuum chamber housing may be separated from one another by means of what are referred to as partition walls (also referred to more generally as chamber walls). In this case, each chamber wall (housing wall or partition wall) may have a substrate transfer opening, such that a substrate may be transferred through the chamber wall, e.g. from a first vacuum chamber to a second vacuum chamber. Furthermore, the vacuum installation may have a substrate transfer opening at an inlet region and/or outlet region, such that a substrate may be introduced into the vacuum installation and/or removed from the vacuum installation. Various substrate transfer openings may be sealed off by means of what are referred to as valve flaps, e.g. when cyclic substrate transfer is to be performed.

In a vacuum installation, gaps of various sizes may be sealed off. A gap of microscopic proportions, which may be sealed off by means of a seal, may remain between two mutually adjoining vacuum components. A gap in the millimeter range (e.g. providing a "clearance fit"), which is sealed off by means of a seal, may be arranged between two vacuum components designed to be movable relative to one another. Two vacuum chambers may be connected to one another by means of a substrate transfer gap, i.e. a gap in the centimeter range, thus enabling a substrate (e.g. a plate) to fit through said gap.

In this case, a seal may be a vacuum seal. The seal may include an elastomer or be formed from an elastomer. The elastomer may be a polymer, e.g. a polymer or copolymer formed from vinylidene (di)fluoride (VDF) (also referred to as Viton). The seal may be a lip seal, a ring seal or similar. In the case of moving components, the seal may be secured on one component (e.g. may be accommodated with positive engagement in a groove) and press against a smooth surface (also referred to as a sealing surface) of the other component, on which it slides during the movement.

According to various aspects of the disclosure, a valve flap (also referred to as a flap) may be moved into a closed position (e.g. position and/or alignment), depending on the pressure separation direction. Both shutoff directions may thus be provided jointly by means of one valve.

According to various aspects of the disclosure, the valve flap may be anchored in the upper part (also referred to as top part) and may be pressed on by the occurring pressure difference in the lower part (also referred to as bottom part).

According to various aspects of the disclosure, an O-ring with or without a lubricant reservoir may be used as a seal. This facilitates assembly and aids production and/or maintenance.

According to various aspects of the disclosure, the valve flap, the valve housing and an optional flange plate may be cooled by means of deep-hole bores. The deep-hole bores may clearly provide a fluid line. This allows the use of a higher substrate temperature, e.g. up to 400° C.

According to various aspects of the disclosure, one or more than one radiation plate may be inserted between the actively cooled components of the valve assembly and the substrate in order to avoid excessive cooling of the substrate. This furthermore makes it possible to use any transfer speed without risking excessive cooling of the substrate.

According to various aspects of the disclosure, the valve assembly may allow a very slight increase in the roller spacings (e.g. 25 mm). This furthermore makes it possible to transfer heated thin substrates safely and reliably.

The complete module of the valve assembly may be installed or removed as a complete unit for simple maintenance/repair, for example. It is thus possible to carry out a change of the seal and adjustment work on the valve flap outside the vacuum installation. The seal system may be designed in such a way that leaks are permissible as long as the pumping capacity is higher than the permissible leakage rate.

According to various aspects of the disclosure, the valve assembly may be installed between two vacuum chambers (including as a retrofit).

According to various aspects of the disclosure, the valve assembly may have one or more than one sensor. By means of a sensor, (e.g. a glass sensor) it is possible to detect a substrate and, based on this, to rotate the valve flap. Alternatively or additionally, a sensor may be configured to detect a temperature of the substrate (e.g. a bolometer).

Optionally, a sensor may be configured to detect the position of the valve flap and, based on this, to rotate the valve flap. Alternatively or additionally, the rotary motion of the valve flap may be driven by means of a stepper motor.

According to various aspects of the disclosure, the vacuum assembly may have a gas feed system, by means of which a purging gas (e.g. argon) or a process gas may optionally be introduced into the substrate transfer gap (clearly for gas separation or the formation of a gas curtain).

According to various aspects of the disclosure, the operation of the installation may also be continued with the valve flap removed by inserting a flange wall (e.g. a flange plate) without a valve flap (clearly as a placeholder). As an option, the flange wall may include a measurement system (e.g. a bolometer for temperature measurement).

Figure 1B:
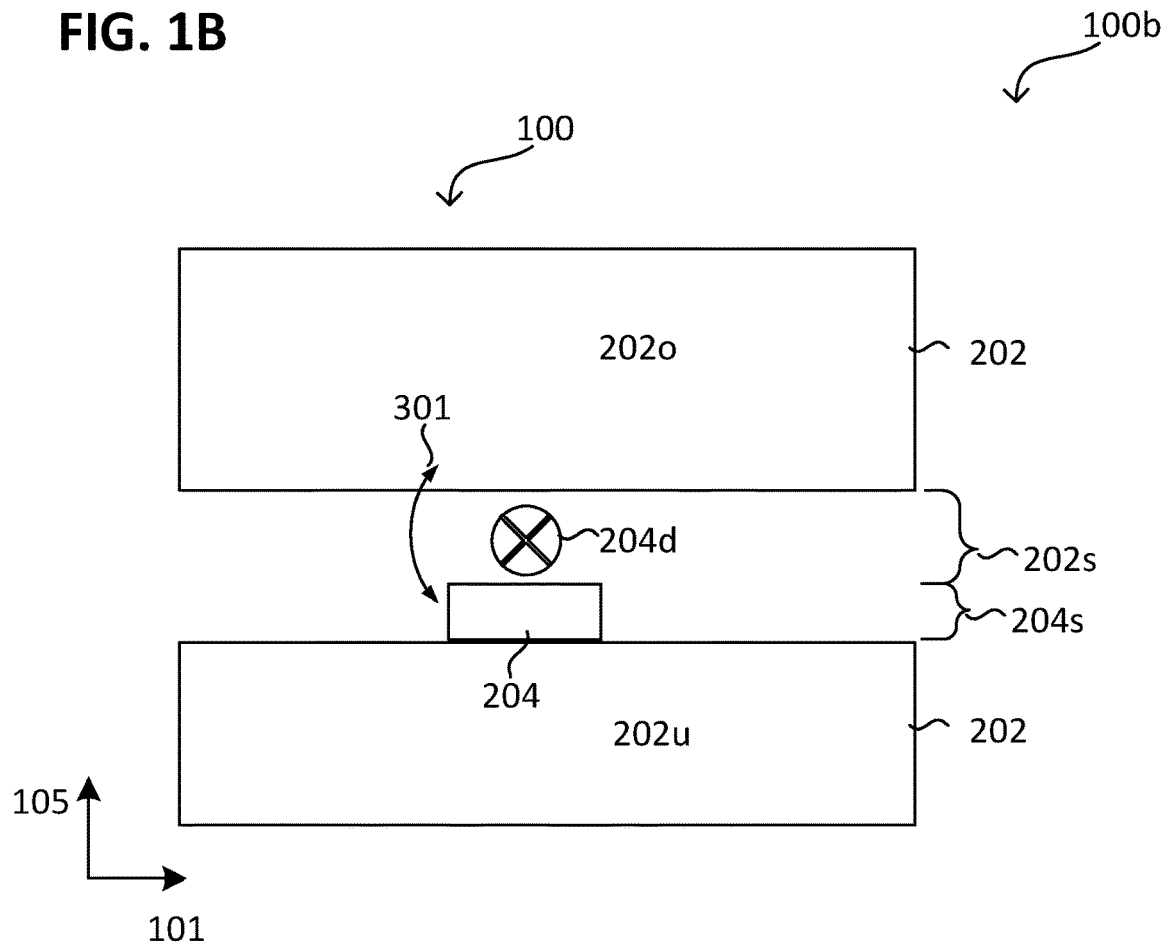

FIG. 1A and FIG. 1B each illustrate a valve assembly 100 according to various aspects of the disclosure in a schematic side view or cross-sectional view in various states 100a, 100b when viewed in a direction along the axis of rotation 204d. The valve housing 202 may have a first side 202o (also referred to descriptively as the upper side) and a second side 202u (also referred to descriptively as the lower side), between which the substrate transfer gap 202s and a receiving space 204s are arranged. The receiving space 204s may be arranged between the substrate transfer gap 202s and the lower side 202u (or, alternatively, also the upper side 202o), for example. In general, the valve assembly 100 may also be installed with the lower side 202u facing upward.

In a first state 100a (also referred to as the closed state 100a), the valve flap 204 may seal off the substrate transfer gap 202s. In a second state 100b (also referred to as the open state 100b), the valve flap 204 may be arranged in the receiving space 204s, with the result that the substrate transfer gap 202s is exposed (e.g. is not blocked by the valve flap 204). As an option, it is also possible for the receiving space 204s to be sealed off in the closed state 100a. Changing between the states 100a, 100b may include rotating 301 the valve flap 204 about an axis of rotation 204d, i.e. changing its position.

Sealing may be performed vacuum-tightly. For example, a pressure ratio of more than approximately $10, 10^2, 10^3, 10^4$ or more may be sealed off by means of the valve flap 204 in the closed state 100a, e.g. for several hours without supplying or removing gas. For example, the pressure difference sealed off (isolated by means of the sealing structure), between which a mass transfer is reduced or prevented, may have a value in a range of a few millibars (mbar) to approximately one bar (bar), e.g. in a range of approximately 1 mbar to approximately 1 bar, e.g. in a range of 1 mbar (in the case of atmosphere to vacuum) or less (in the case of vacuum to vacuum).

The substrate transfer gap 202s may pass through the valve housing 202 along a direction 101 (also referred to as the transfer direction 101). The axis of rotation may be transverse to the transfer direction 101.

Figure 2A:
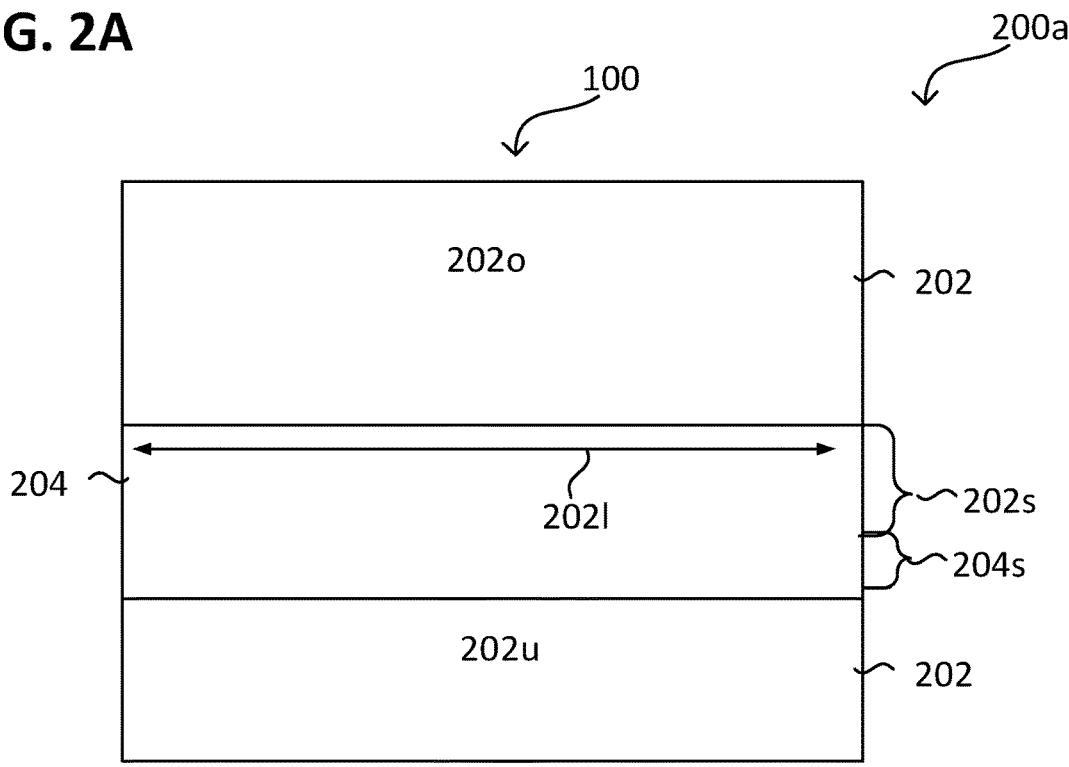
Figure 2B:
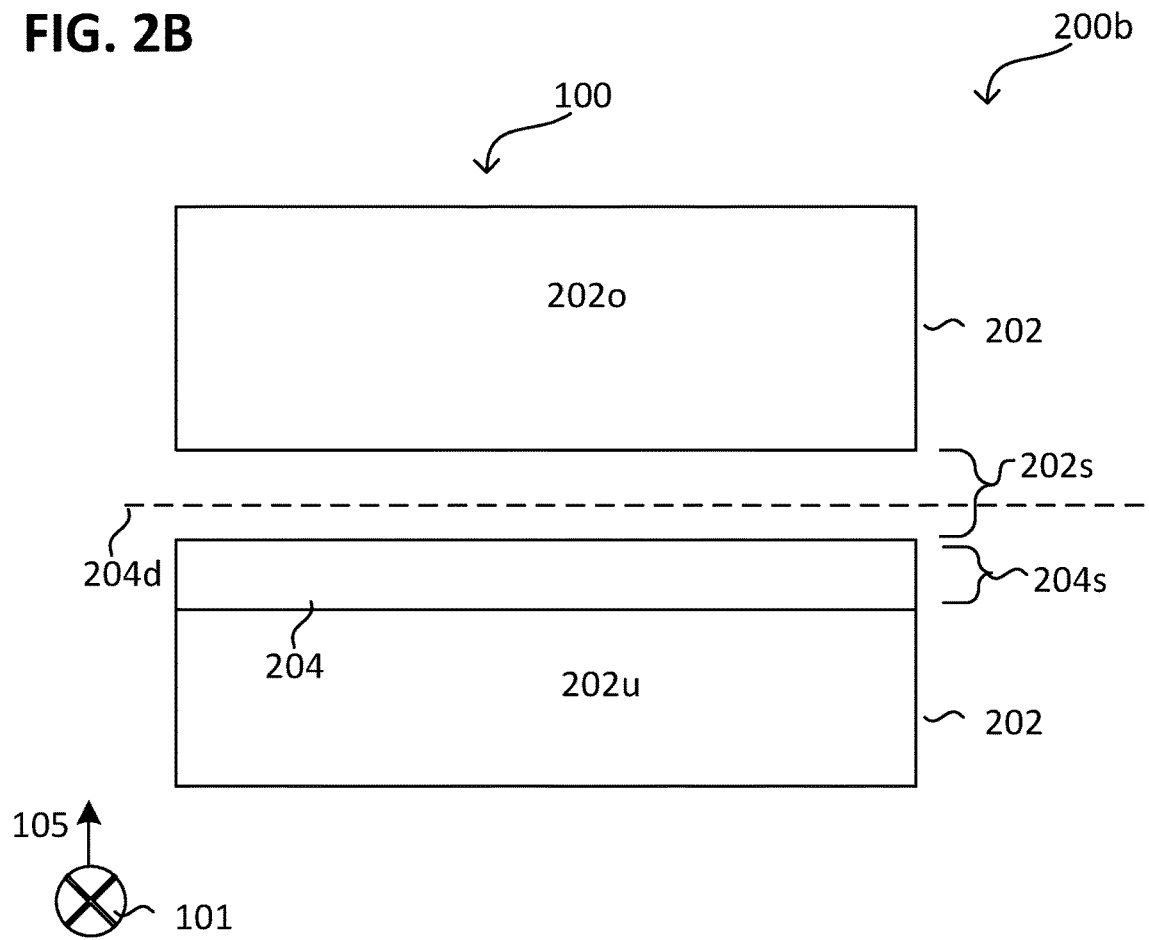

FIG. 2A and FIG. 2B each illustrate the valve assembly 100 in a schematic side view or cross-sectional view 200a, 200b when viewed in a direction transverse to the axis of rotation 204d, wherein FIG. 2A shows the closed state 100a, and FIG. 2B shows the open state 100b. The valve flap 204 and the substrate transfer gap 202s may be extended longitudinally along the axis of rotation 204d. For example, the longitudinal extent 202l of the substrate transfer gap 202s may be more than approximately 1 m (meter), 2 m, 3 m or than approximately 4 m. The extent (also referred to as height) of the substrate transfer gap 202s transversely to the axis of rotation 204d may be less than 0.5 m, 0.25 m or 0.1 m. The smaller the height, the greater gas separation may be. The height may be transverse to the transfer direction 101. The aspect ratio (ratio between the largest extent and the smallest extent) may then be greater than approximately 10 or than approximately 100, for example. The valve flap 204 may have similar dimensions.

The longitudinal extent of the valve flap 204 may be greater than the longitudinal extent 202l of the substrate transfer gap 202s, for example.

Figure 3A:
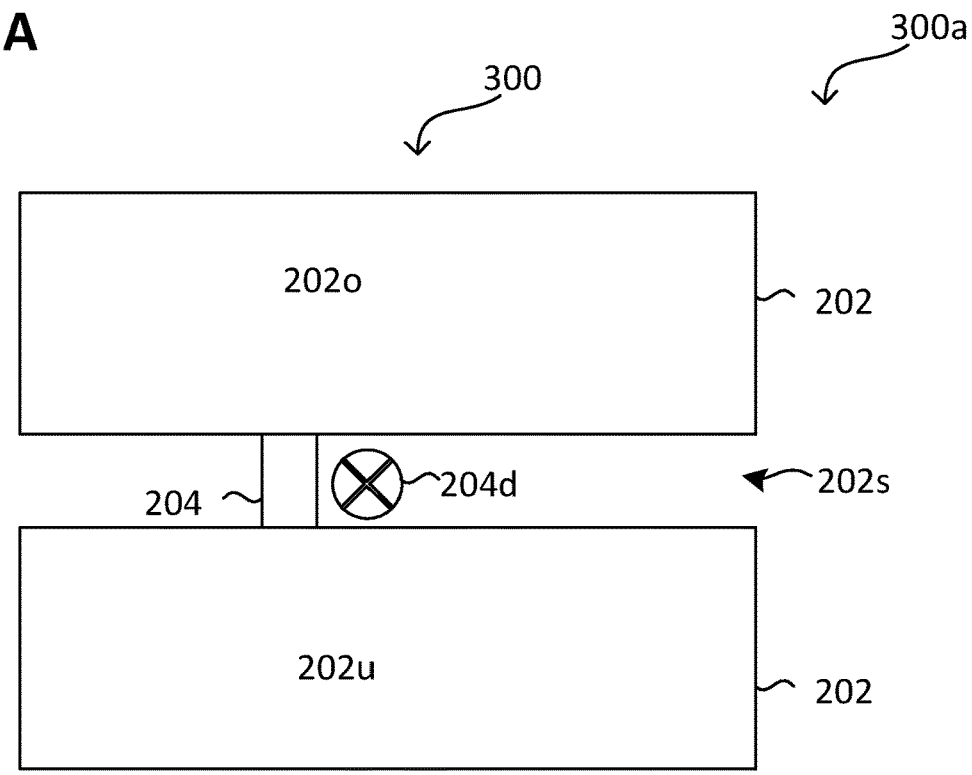
Figure 3B:
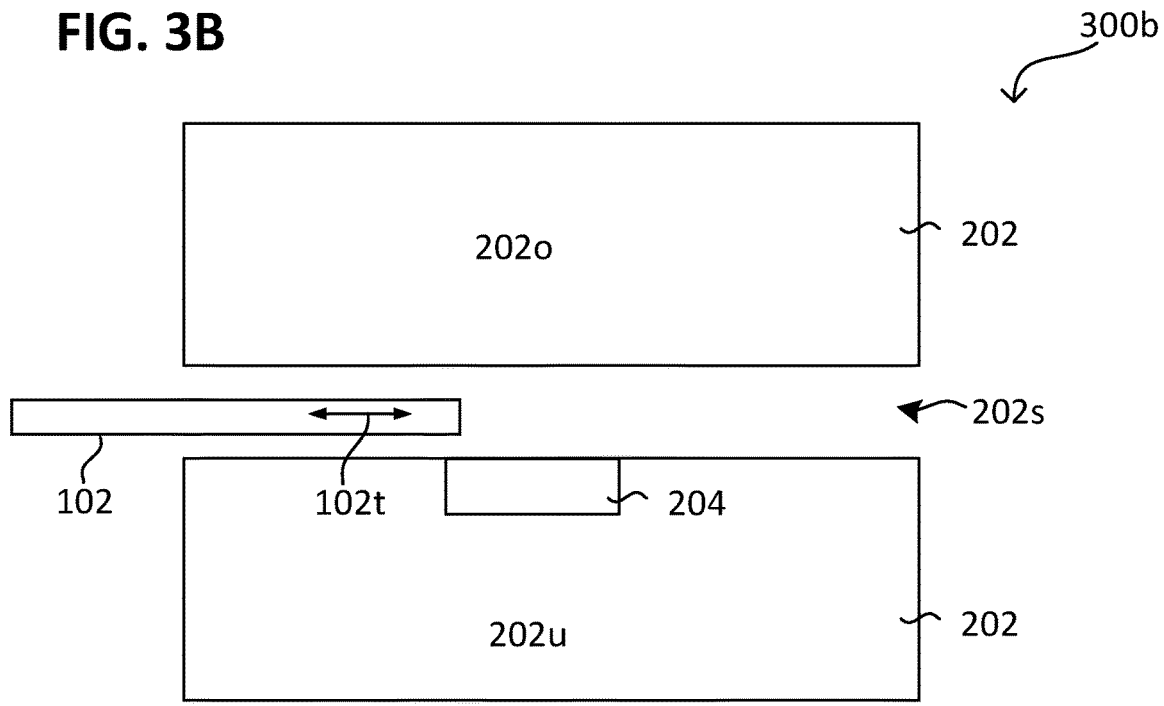
Figure 3B:
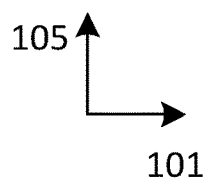

FIG. 3A and FIG. 3B each illustrate the valve assembly 100 in a view 300a, 300b similar to FIG. 1A and FIG. 1B. In 300a, the valve flap 204 may be in a first position (clearly closed) and in 300b may be in a second position (clearly open). In operation, the valve may be switched over from the closed state 100a to the open state 100b, with the result that the valve flap is rotated about the axis of rotation 204d between the first position and the second position (see movement 301 in FIG. 1B). In the open state 100b, a substrate 102 may be transferred 102t through the substrate transfer gap 202s, e.g. along a transfer direction 101. Alternatively or additionally, more gas (e.g. a larger standard volume flow) may pass through the substrate transfer gap 202s in the open state 100b than in the closed state 100a.

The substrate 102 may optionally have a temperature of more than approximately 100° C., e.g. more than approximately 200° C., e.g. more than approximately 300° C., as it is transferred through the substrate transfer gap 202s. For this purpose, the substrate may be irradiated, e.g. with thermal radiation, as it is transferred into the substrate transfer gap 202s and/or out of said gap. The thermal radiation may be emitted by a heating device 1202, for example (cf. FIG. 12).

The substrate 102 may be transferred by means of transfer rollers (e.g. including or being formed from glass, e.g. quartz glass).

In the open state 100b, a vacuum (i.e. a pressure less than 0.3 bar) and/or a pressure in a range of approximately 1 mbar to approximately $10^{-3}$ mbar (in other words a medium vacuum) and/or a pressure in a range of approximately $10^{-3}$ mbar to approximately $10^{-7}$ mbar (in other words a high vacuum) or a pressure of less than a high vacuum, e.g. less than approximately $10^{-7}$ mbar (in other words an ultrahigh vacuum) may be provided in the substrate transfer gap 202s. For example, the substrate 102 may be transferred through the vacuum. In the closed state 100a, the valve flap 204 may be exposed to the vacuum on at least one (i.e. one or more than one) side and/or may be exposed to a pressure difference (e.g. of more than approximately 10 mbar, e.g. more than approximately 100 mbar, e.g. more than approximately 1000 mbar). In the open state 100a, the pressure difference may be smaller (e.g. substantially zero).

Figure 4A:
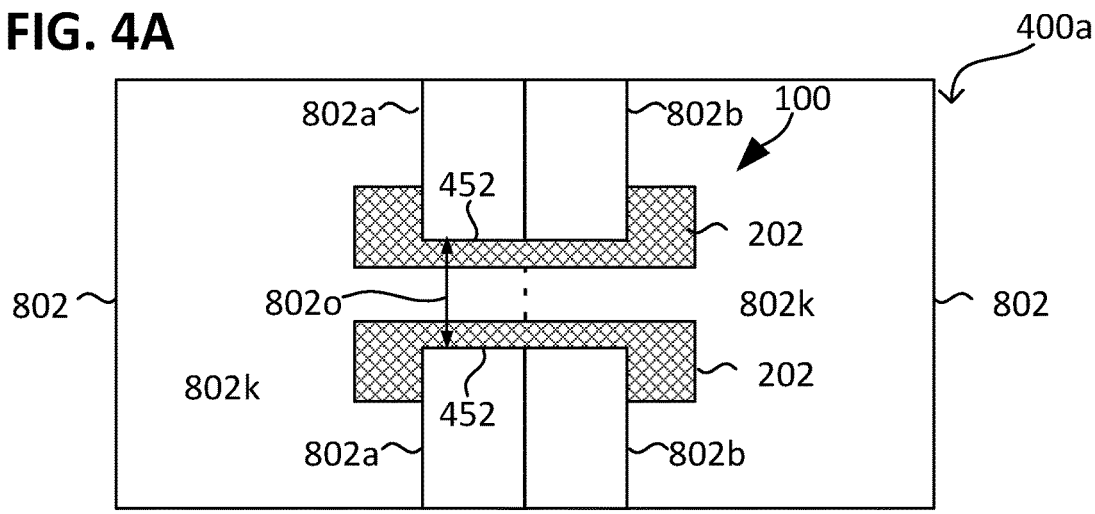
FIGS. 4A, 4B to 4C each show a vacuum assembly according to various aspects of the disclosure in various configurations in a schematic side view or cross-sectional view.
Figure 4B:
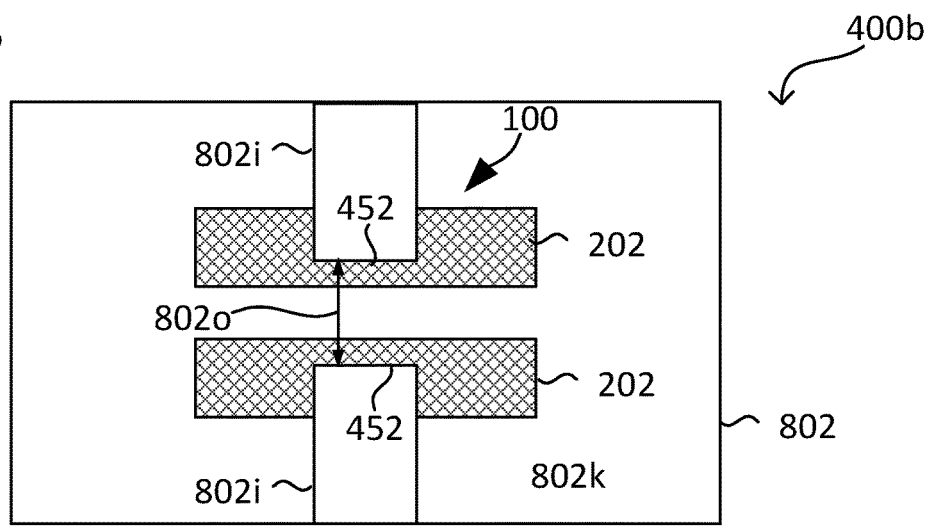
Figure 4C:
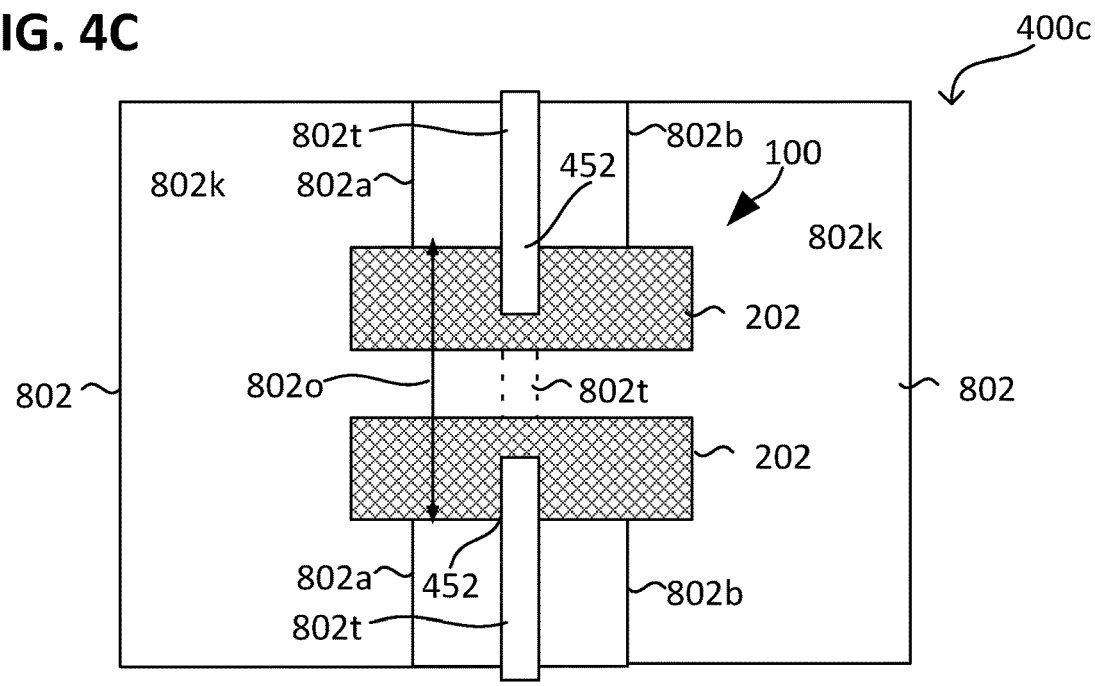

FIG. 4A, FIG. 4B and FIG. 4C each illustrate a vacuum assembly according to various aspects of the disclosure in various configurations 400a, 400b, 400c in a view similar to FIG. 1A. The vacuum assembly may have the valve assembly 100.

The valve housing 202 may have a peripheral coupling structure 452, to which one or more than one vacuum chamber housing 802 is coupled. The coupling structure 452 may have one or more than one groove, one or more than one screw 416, through openings or threaded holes, eyes, seals or the like, for example.

The top part 202o and the bottom part 202u of the valve housing 202 (in each case on the upper side 202o and lower side 202u, respectively) may each have a groove in which a chamber wall 802a, 802b, 802i is received, for example. Alternatively or additionally, the coupling structure 452 may be configured to be able to bear the weight of the valve assembly. This makes it possible to transfer and/or assemble the valve assembly as a coherent module. For example, a crane may be hooked into two eyes of the coupling structure 452.

Each chamber wall (housing wall 802a, 802b or partition wall 802i) may include a through opening 802o (also referred to as a substrate transfer opening 802o) extending through the chamber wall (e.g. in direction 101), in which the axis of rotation 204d and/or the valve flap 204 is/are arranged.

In configuration 400a, it is possible, for example, for two vacuum chamber housings 802 to adjoin one another with their housing walls 802a, 802b, wherein the adjoining housing walls 802a, 802b are coupled to the coupling structure 452 (being received in the groove, for example).

In configuration 400b, a vacuum chamber housing 802 may have a partition wall 802i, which separates two adjoining vacuum chambers from one another, wherein the partition wall 802i is coupled to the coupling structure (being received in the groove, for example).

In configuration 400c (also referred to as adapter configuration), the coupling structure 452 may have a flange wall 802t, which adjoins the two vacuum chamber housings 802 (at the housing walls 802a, 802b thereof) and is coupled to them, wherein the flange wall 802t is received in the groove, for example.

A valve assembly configured in accordance with the adapter configuration 400c may make it easier to use the valve assembly in an existing vacuum installation. It is often the case that an existing vacuum installation does not have the required prerequisites to enable it to be converted. By means of the flange wall 802t, these prerequisites may be created without having to make major changes to the existing installation.

The flange wall 802t may be of very thin design, for example, with the result that the distance between the two chamber housings 802 adjoining said wall (corresponding to the thickness of the flange wall 802t) may be less than approximately 10 cm (centimeters), e.g. less than approximately 8 cm (or 5 cm), e.g. less than approximately 4 cm (or 3 cm). Alternatively or additionally, the distance between the two chamber housings 802 or the thickness of the flange wall 802t may be less than the distance between mutually directly adjacent transfer rollers of a transfer device of the vacuum assembly.

The flange wall 802t may then have a supply structure, for example. The supply structure may have one or more than one fluid connection, one or more than one fluid line, a bearing assembly and/or a holding structure for a drive. This achieves the effect that the valve assembly in the adapter configuration 400c may be prefabricated as a coherent and operational module and may be inserted as a complete unit between two chamber housings 802.

The valve assembly 100 according to configuration 400a may be used, for example, when the vacuum assembly is redesigned. The supply structure for the valve assembly 100 may then be installed in one of the chamber walls 802a, 802b, for example.

The valve assembly 100 according to configuration 400b may be used, for example, when the vacuum assembly is redesigned or, alternatively, to convert an existing vacuum assembly. The supply structure for the valve assembly 100 may then be installed in the partition wall 802i, for example.

Figure 5:
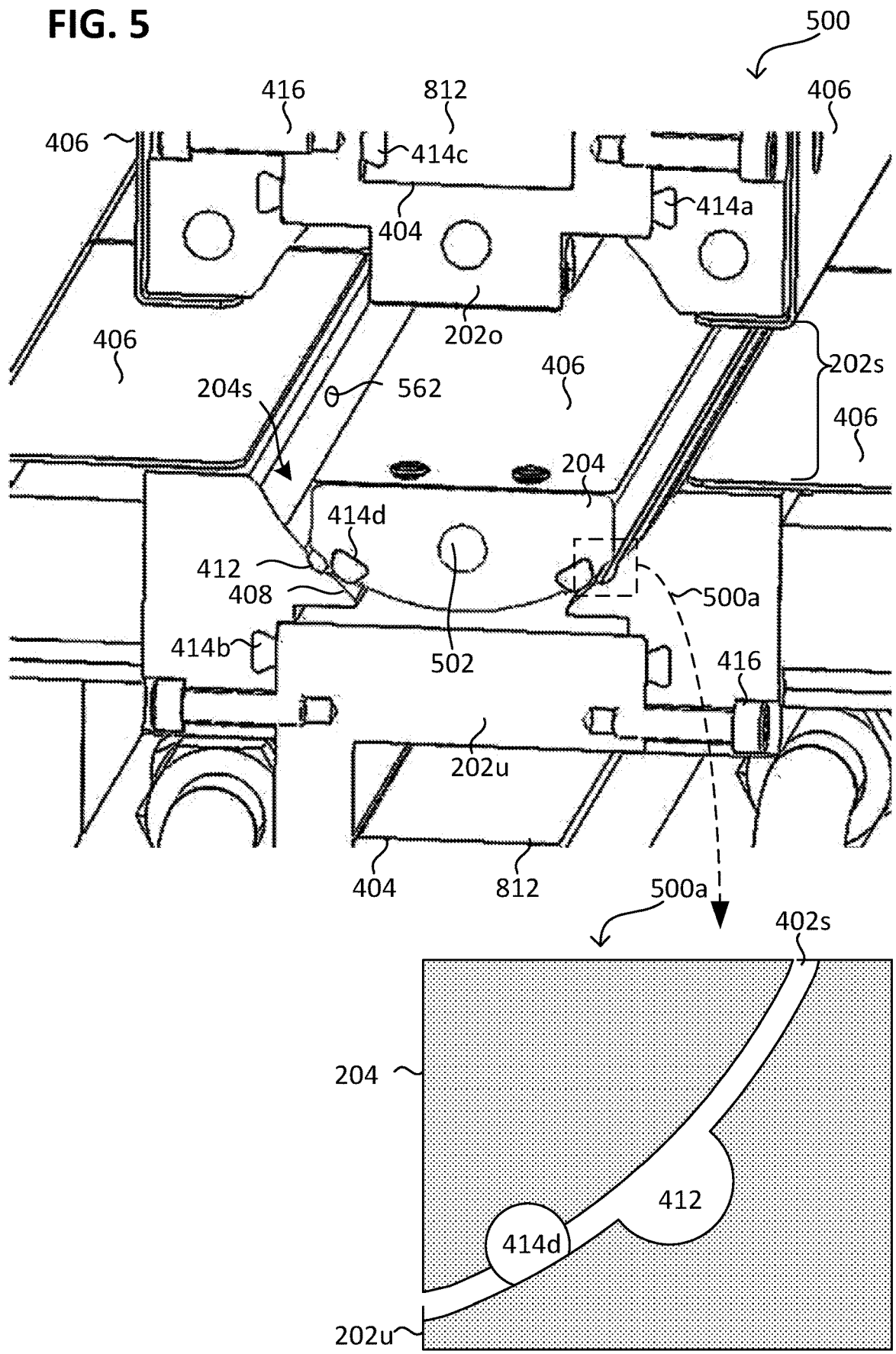
FIGS. 5 and 6 show a valve assembly according to various aspects of the disclosure in various schematic sectioned perspective views.

FIG. 5 illustrates a valve assembly 500 according to various aspects of the disclosure in a schematic perspective view in the open state, e.g. the valve assembly 100, and a schematic detail view 500a. The coupling structure 452 may optionally have one or more than one seal 414c, which rests against a wall element 812 (e.g. a flange wall 802t, a partition wall 802i or a housing wall 802a, 802b) and the valve housing 202. Optionally, the valve housing 202 may be of multi-part configuration, the parts of which rest against corresponding seals 414a, 414b.

The receiving space 204s may be provided by means of a recess 408 in the lower side 202u. The recess 408 may optionally have a concavely curved surface, against which a seal 414d of the valve flap 204 rests. The valve flap may have a matching convex surface, on which the seal 414d is secured. The seal may run around the substrate transfer gap 202s, for example, when the valve flap 204 is in the closed position.

Alternatively or additionally, the seal may also be secured on the valve housing 202 (e.g. the underside 202u or upper side 202o) and may then rest against the valve flap 204 in the closed position and/or may be at a distance from the valve flap 204 in the open position. In this case, however, the seal may be more exposed to the heat radiation. The seal may run around the substrate transfer gap 202s, for example, if said seal is secured on the valve housing 202.

The gap 402s between the valve flap 204 and the lower side 202u may have a lubricant chamber 412. The lubricant chamber 412 may be connected, for example, to a lubricant passage extending through the valve housing 202. A lubricant, e.g. a grease or a paste, may be arranged in the lubricant chamber 412. This improves sealing.

The valve assembly 500 may have a radiation shielding 406, which faces the substrate transfer gap 202s. The radiation shielding 406 reduces heat loss from the heated substrate. The radiation shielding 406 optionally reduces the thermal stress on the valve assembly 500 if the substrate 102 is raised to a high temperature (i.e. is heated). The radiation shielding 406 may have one or more than one radiation shield (e.g. having a plate). Each radiation shield may have one or more than one pair of layers (e.g. a stack of pairs). A first layer (also referred to as an insulating layer) of the pair may be of thermally insulating configuration. A second layer of the pair (also referred to as a reflected radiation layer) may be arranged between the insulating layer and the substrate transfer gap 202s (separating them spatially from one another, for example). The radiation layer may include or be formed from a metal, for example, and/or may be polished. The insulating layer may include or be formed by a dielectric or a cavity, for example.

Alternatively or additionally to the radiation shielding 406, the valve assembly 500 may have a fluid cooling system. This reduces the thermal stress on the valve assembly 500 if the substrate 102 is raised to a high temperature. The fluid cooling system may have one or more than one fluid line 502, which is configured to bring a cooling fluid (e.g. including a liquid and/or a gas) into thermal contact with the valve flap 204 and/or the valve housing 202. This makes it possible to remove thermal energy from the valve flap 204 and/or the valve housing 202 by means of the cooling fluid. For example, the valve flap 204 and/or the valve housing 202 may include one or more than one fluid line extending through the valve housing 202. The fluid cooling system may furthermore have two fluid connections, which are coupled to one another by means of the or each fluid line. The cooling fluid may include or be formed by water, for example.

As an option, a gas feed system may be provided, which has one or more than one gas outlet nozzle 562. Moreover, the gas feed system may have a fluid line which couples a plurality of gas outlet nozzles 562 to one another or to a gas connection. The or each gas outlet nozzle may have a bore on the left and/or on the right of the valve flap 204, for example.

Figure 6:
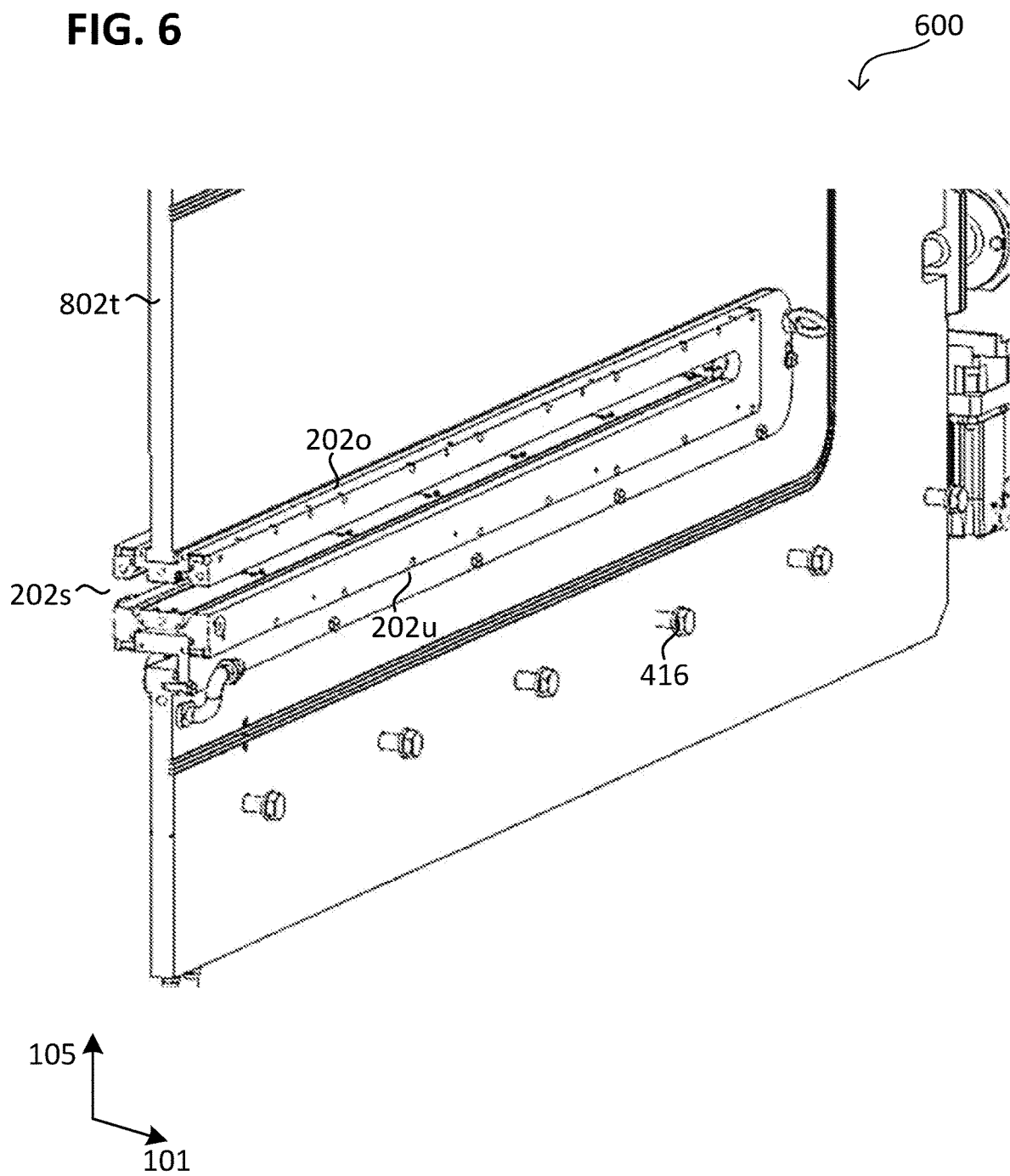

FIG. 6 illustrates a valve assembly 600 according to various aspects of the disclosure in a schematic perspective view in the open state, e.g. the valve assembly 100 or 500. The valve assembly 600 may be configured for assembly in the configuration 400c.

For example, the flange wall 802t may include a plurality of through openings extending through the flange wall 802t, through which screws 416 connect the two chamber housings 802 to one another.

Figure 7:
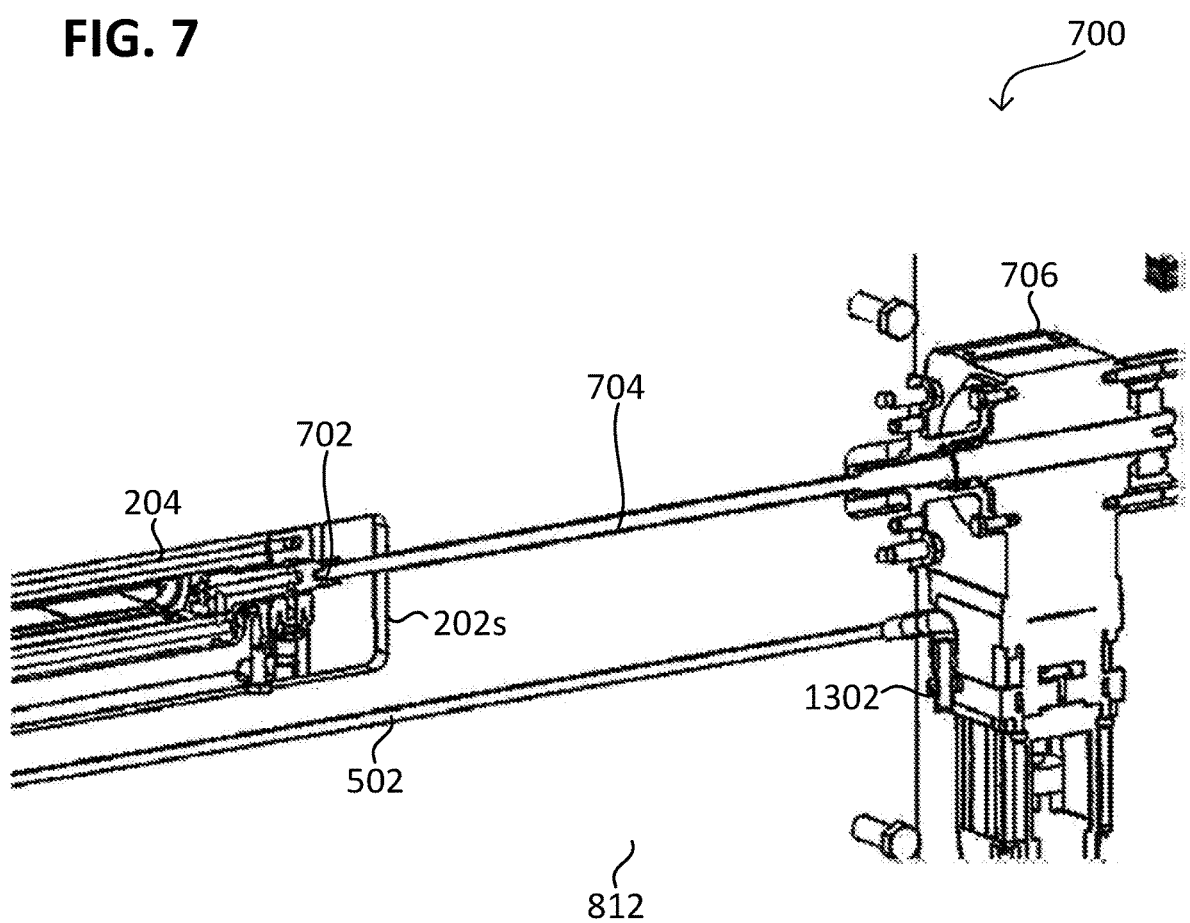
FIG. 7 shows a valve assembly according to various aspects of the disclosure in a schematic cross-sectional view.

FIG. 7 illustrates a valve assembly 700 according to various aspects of the disclosure in a schematic cross-sectional view (sectioned along the axis of rotation 204d), e.g. the valve assembly 100, 500 or 600. The axis of rotation 204d may be provided by means of a bearing assembly 702 of the valve assembly 700. The bearing assembly 702 may rotatably support the valve flap 204. The bearing assembly 702 may have one or more than one rotary bearing, for example (e.g. on opposite sides).

Furthermore, the valve assembly 700 may have a shaft 704 and a drive 706. The shaft 704 may, for example, be supported by means of the bearing assembly 702 and/or may extend through the wall element 802 (e.g. in each case along the axis of rotation 204d). The shaft 704 may couple the drive 706 to the valve flap 204.

Figure 8A:
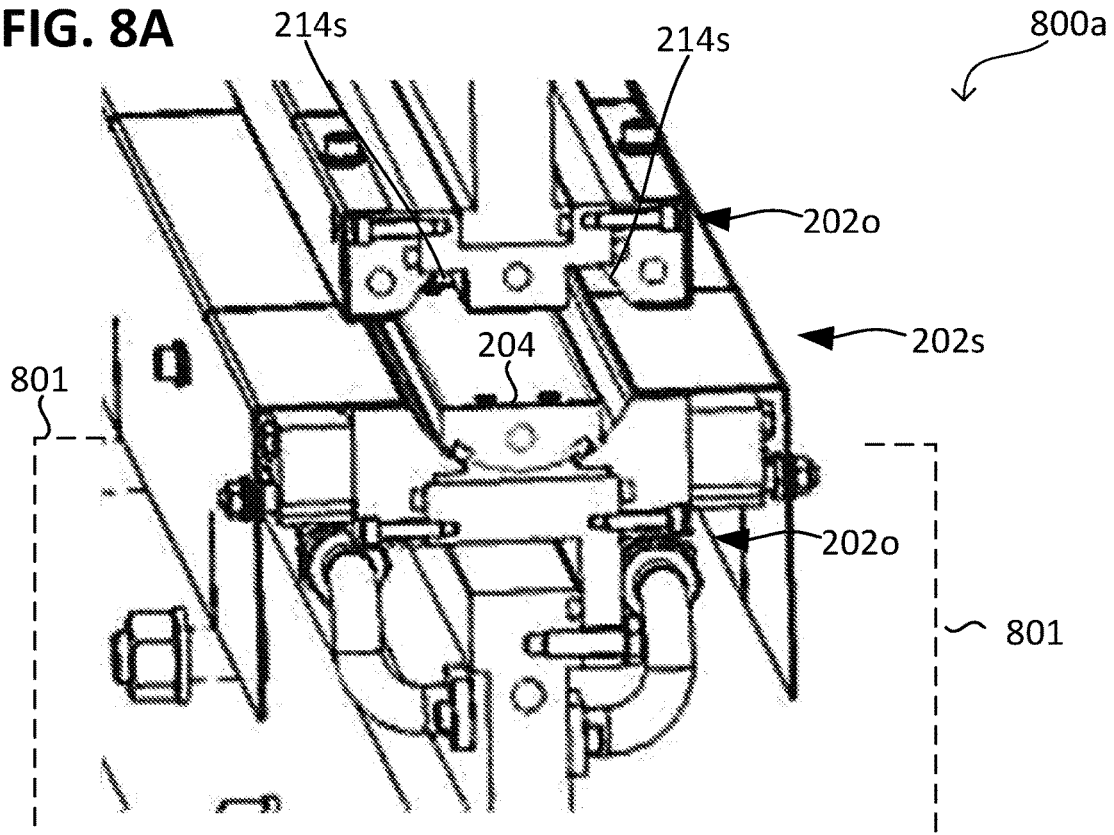
FIGS. 8A, 8B and 8C each show the valve assembly according to various aspects of the disclosure in a schematic sectioned perspective view.
Figure 8B:
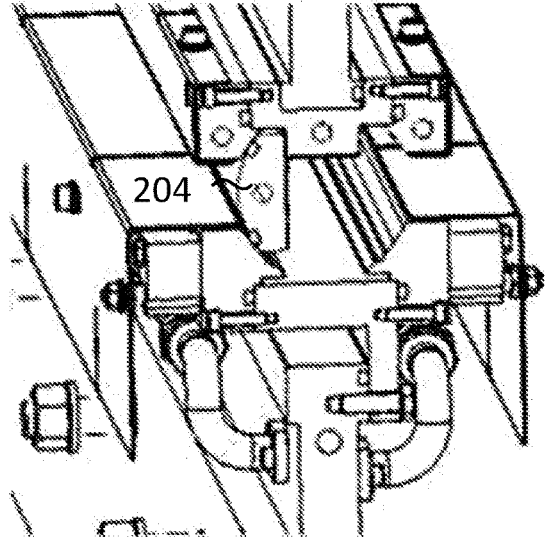
Figure 8C:
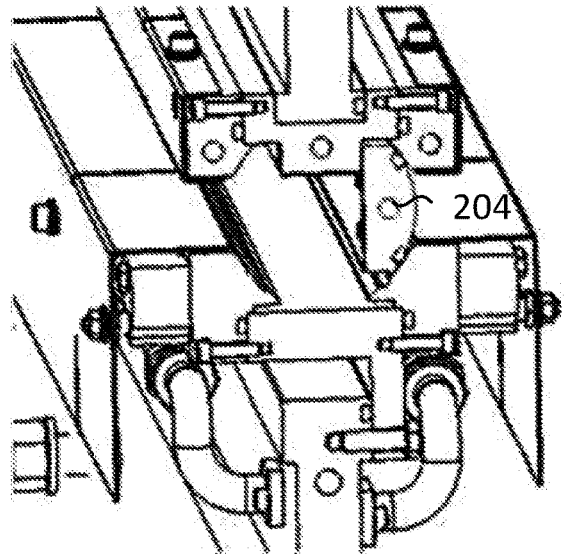

FIG. 8A, FIG. 8B and FIG. 8C each illustrate the valve assembly 600 according to various aspects of the disclosure in a sectioned perspective view 800a, 800b, 800c (sectioned transversely to the axis of rotation 204d), wherein FIG. 8A shows the open state 100b and FIG. 8B and FIG. 8C show two closed states 100b. In other words, the valve flap 204 may also be rotated into two different positions in which the substrate transfer gap 202s is closed. Changing 801 between the two closed states 100b may include opening the valve flap (see 800a) and closing it again (see 800b and 800c). In other words, changing 801 between the two closed states 100b may include rotating the valve flap 204 through the receiving space 204s.

The two closed states 100b make it possible to adapt the sealing effect of the valve flap to the direction of the pressure difference. Clearly, the pressure difference may transmit a force to the valve flap 204. Once the valve flap 204 is aligned according to the force, the force may press the valve flap 204 against the valve housing 202 (e.g. the upper side 202o and/or lower side 202u), which improves the sealing effect. In order to further improve this effect, the upper side 202o may have one or more than one recess (clearly additional receiving space), in which the valve flap 204 may fit with positive engagement, as described in greater detail below.

Figure 9A:
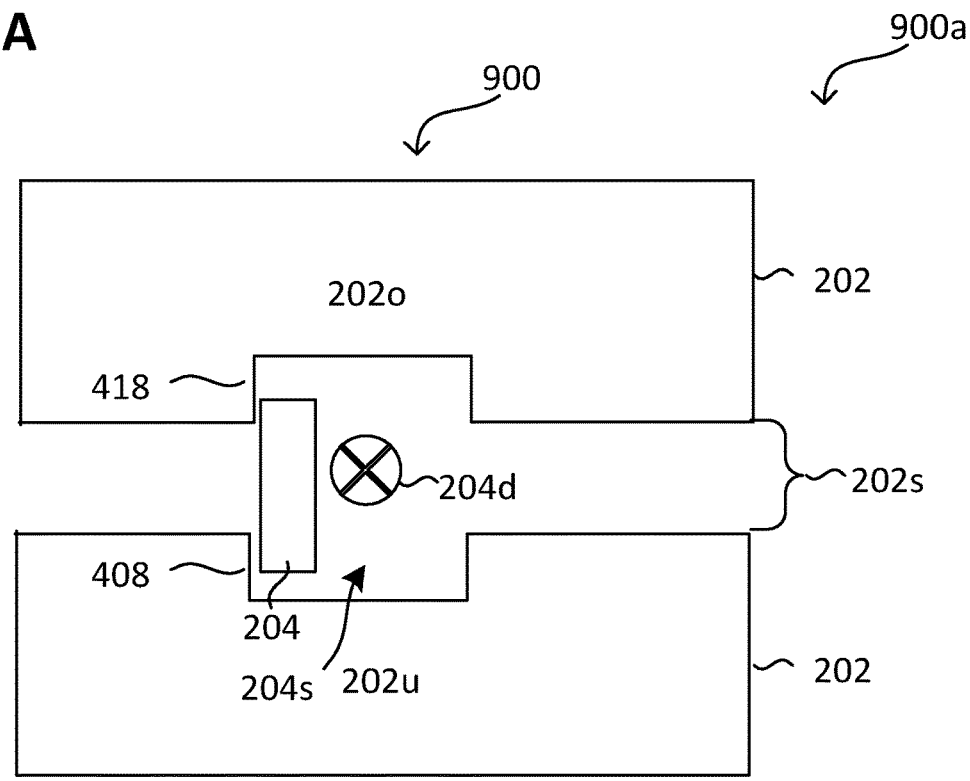
FIGS. 9A and 9B each show a valve assembly according to various aspects of the disclosure in a schematic side view or cross-sectional view.
Figure 9B:
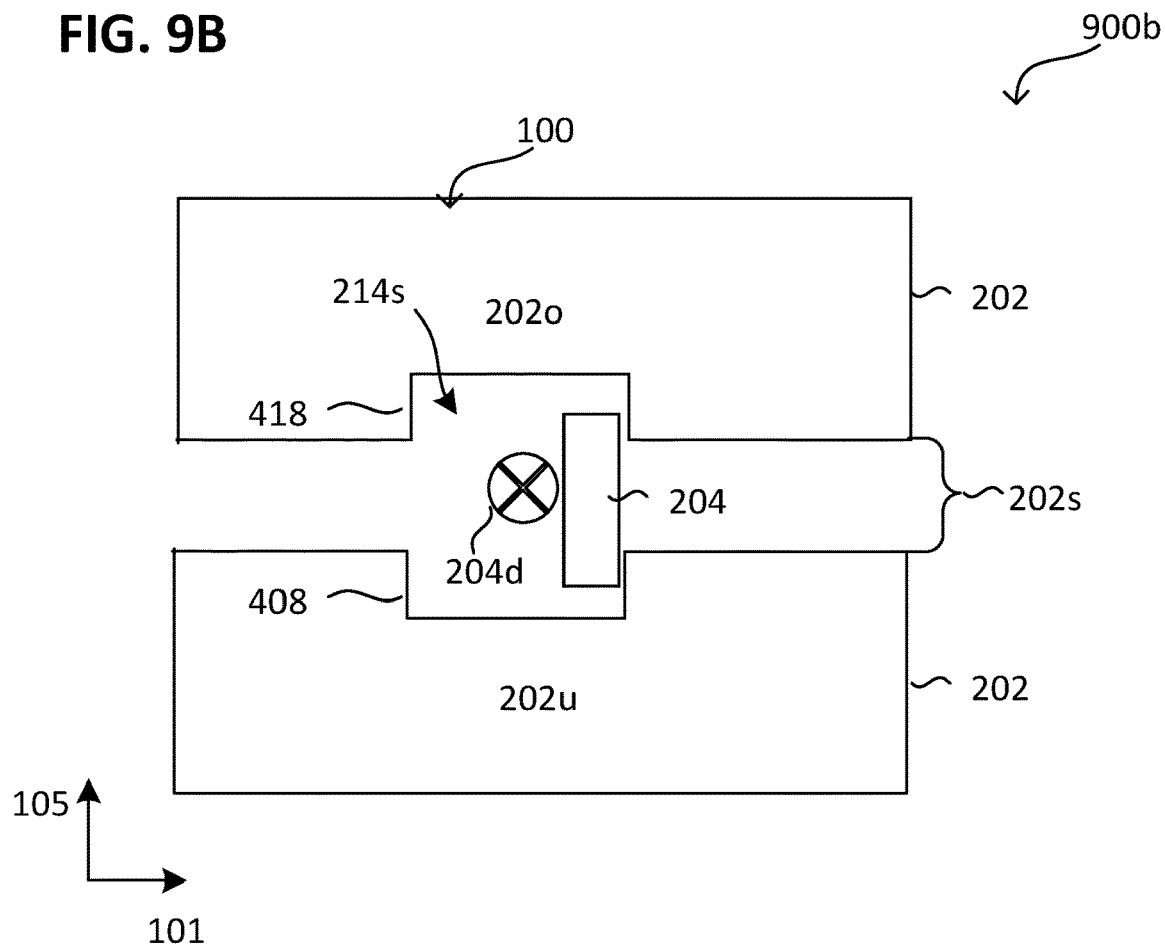

FIG. 9A and FIG. 9B each illustrate a valve assembly 900 according to various aspects of the disclosure in a view similar to FIG. 1A in the two different closed states 900a, 900b.

The lower side 202u may have a first recess, which provides a first receiving space 204s, for example. The upper side 202o may have one or more than one second recess, of which each recess provides a second receiving space 214s, for example. In each of the closed states 900a, 900b, the valve flap may engage in each of the two receiving spaces 204s, 214s. The valve flap 204 may then be extended through the substrate transfer gap 202s. Each of the receiving spaces 204s, 214s may be provided by means of a recess 408, 418, matching the valve flap 204, in the valve housing 202.

Once the seal 414d has been secured on the valve flap 204, it may thus be corotated. The seal 414d may then rest against the top part 202o in each of the closed states 900a, 900b.

Alternatively or additionally, it is also possible for a corresponding seal to be secured on the valve housing 202 (e.g. the top part 202o and/or the bottom part 202u). The seal 414d may then run around the substrate transfer gap 202s, for example.

Figure 10:
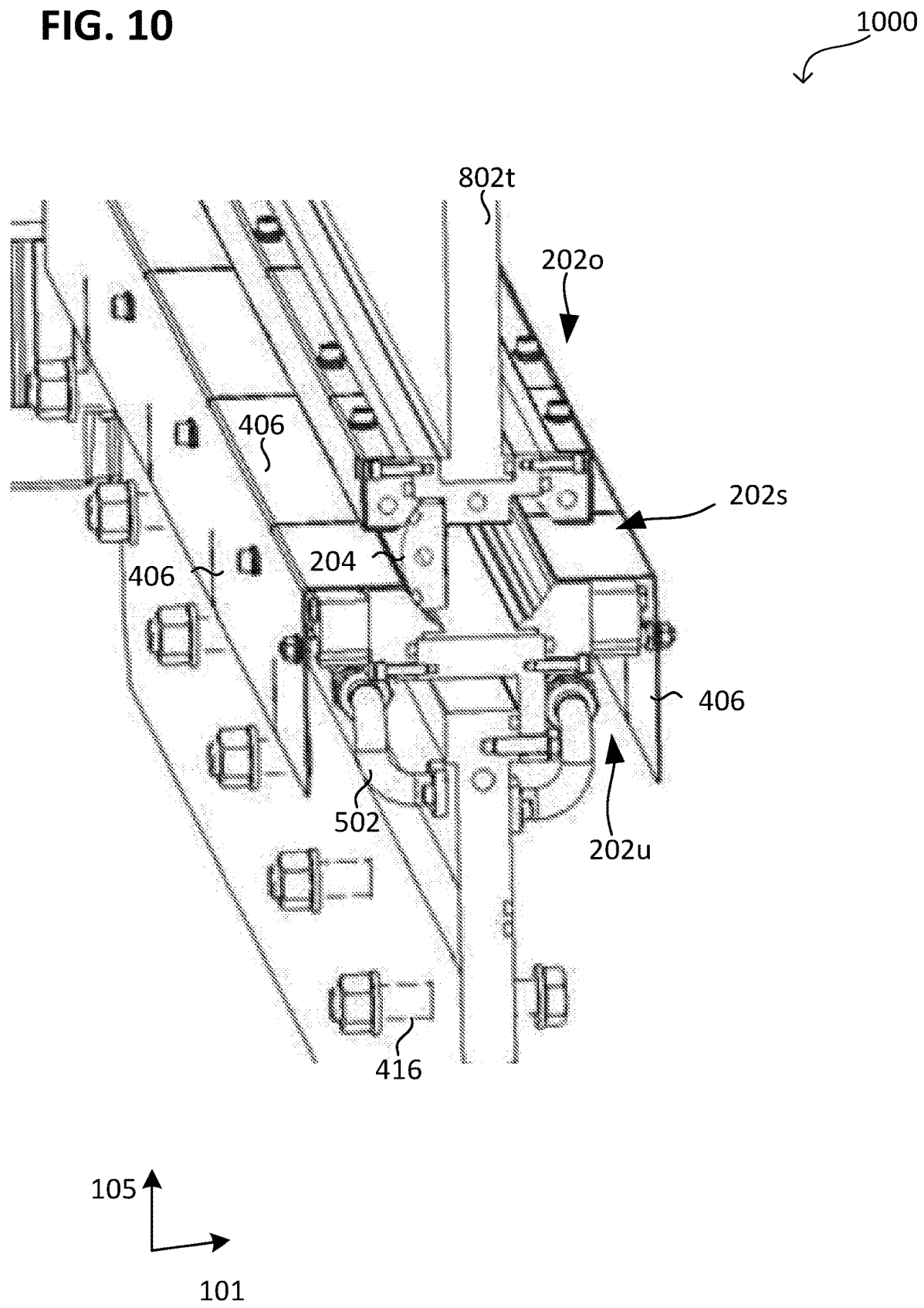
FIGS. 10 and 11 each show a valve assembly according to various aspects of the disclosure in various schematic views.

FIG. 10 illustrates a valve assembly 1000 according to various aspects of the disclosure in a first closed state similar to the valve assembly 600, wherein the valve assembly 1000 furthermore has a radiation shielding 406, which delimits the substrate transfer gap 202s.

Figure 11:
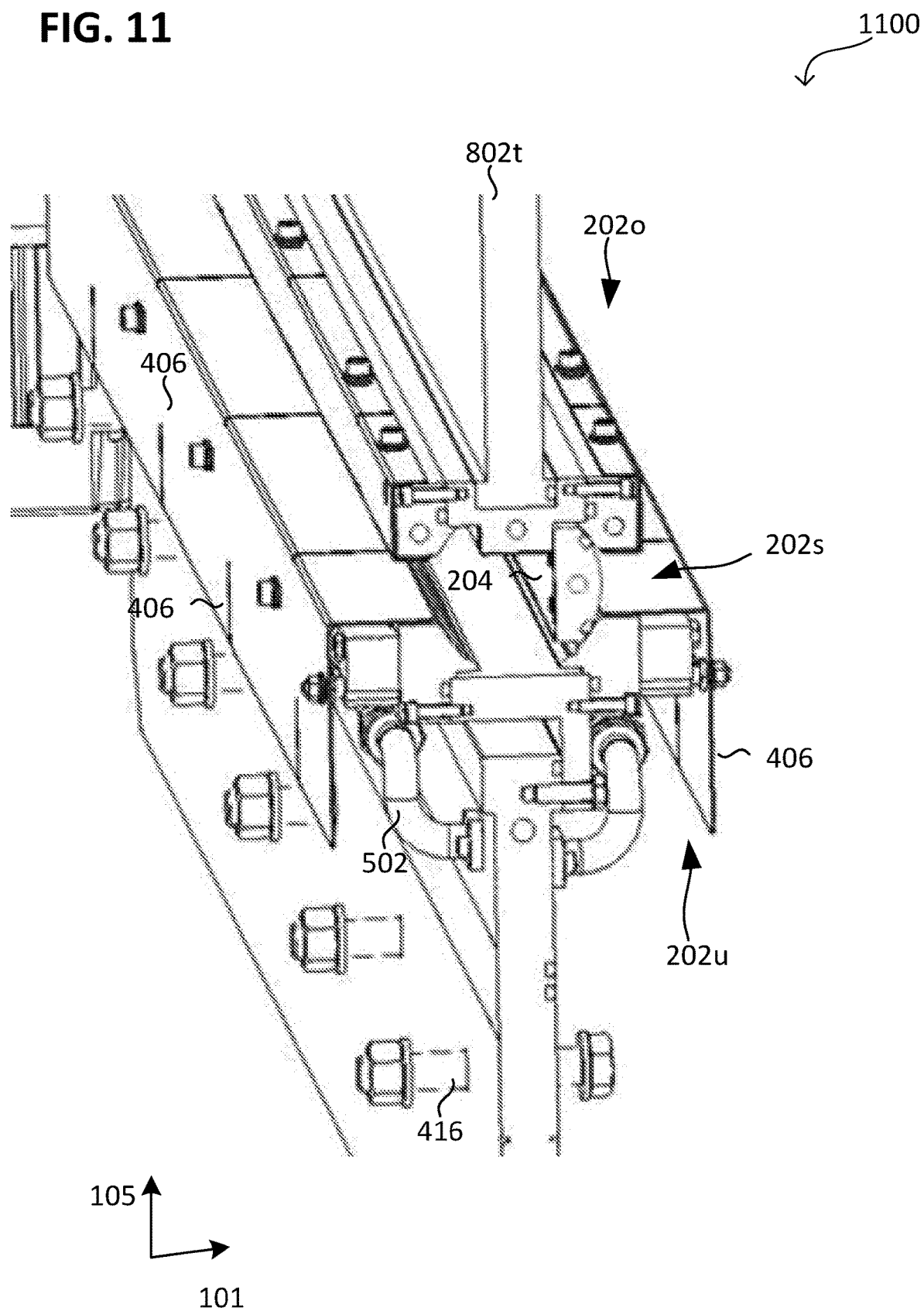

FIG. 11 illustrates a valve assembly 1100 according to various aspects of the disclosure in a second closed state similar to the valve assembly 600, wherein the valve assembly 1100 furthermore has a radiation shielding 406, which delimits the substrate transfer gap 202s.

Figure 12:
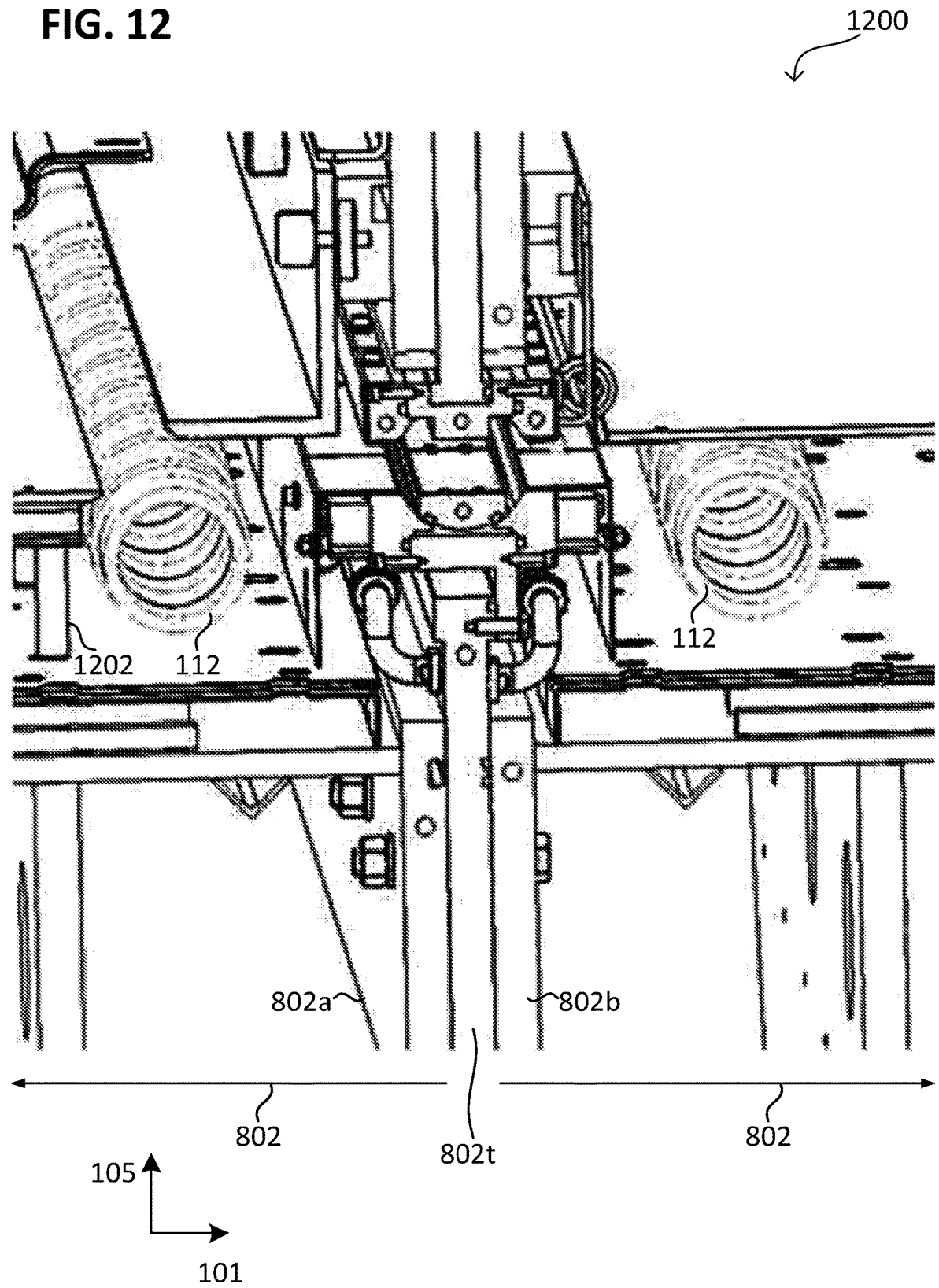
FIGS. 12 to 14 each show a vacuum assembly according to various aspects of the disclosure in various schematic views.

FIG. 12 illustrates a vacuum assembly 1200 according to various aspects of the disclosure in an adapter configuration similar to the adapter configuration 400c in a sectioned perspective view (sectioned transversely to the axis of rotation 204d).

According to various aspects of the disclosure, the vacuum assembly 1200 may have one or more than one heating device 1202 on the valve assembly 600, e.g. a first heating device 1202 in a first chamber housing 802 and/or a second heating device 1202 in a second chamber housing 802. This makes it possible to counteract cooling of the substrate.

Figure 13:
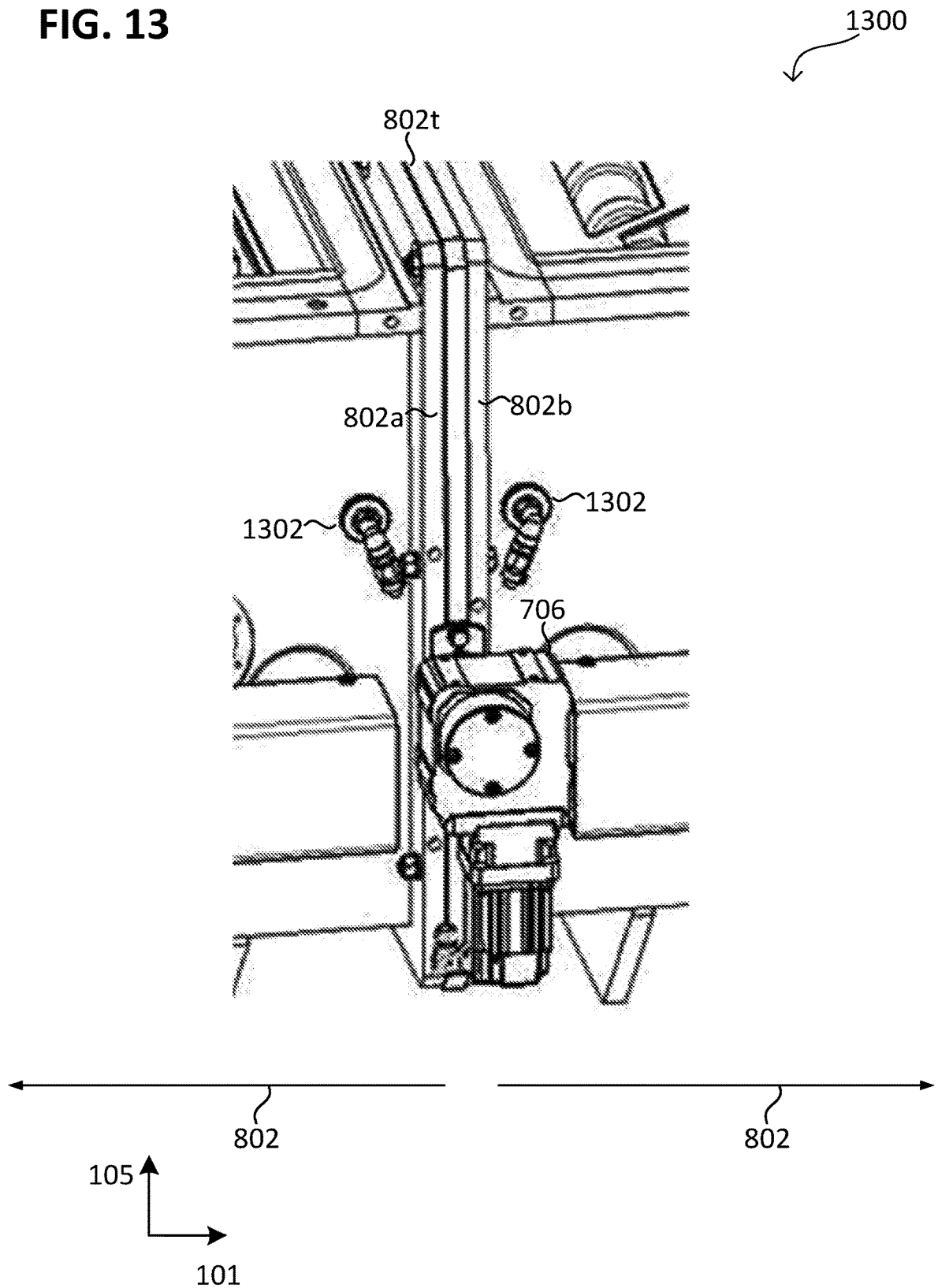

FIG. 13 illustrates the vacuum assembly 1200 in a perspective side view 1300. The drive 706 may be secured on the flange wall 802t. The fluid connections 1302 may furthermore also be secured on the one or more than one vacuum chamber housing 802. This facilitates assembly/disassembly.

Figure 14:
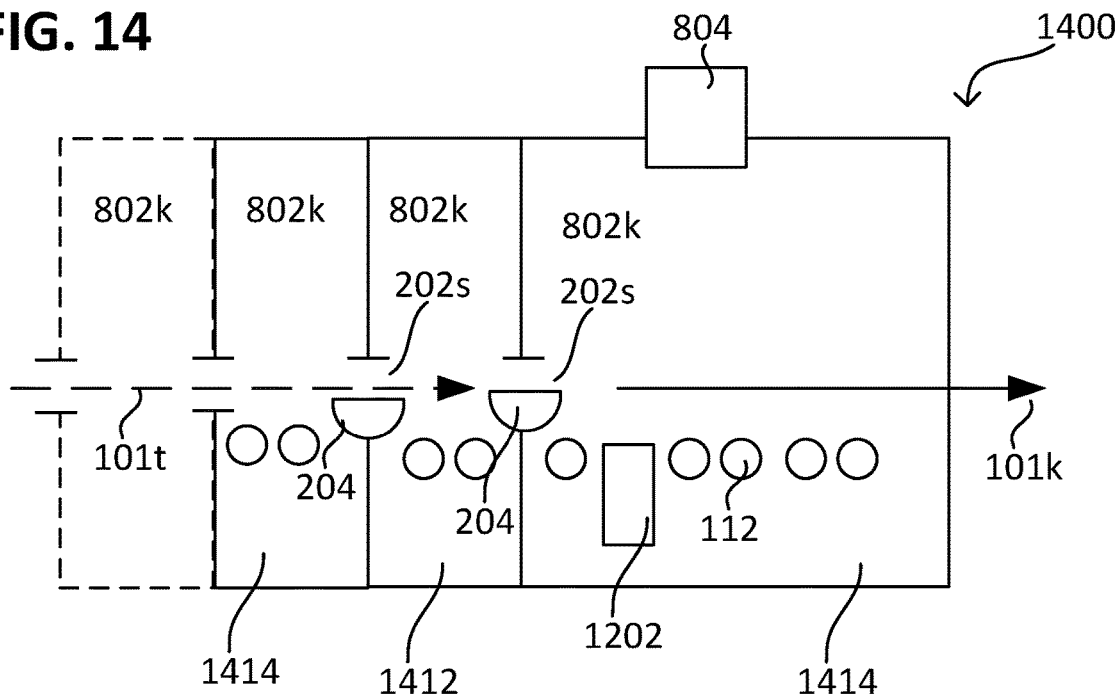
Figure 14:
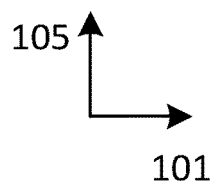
Figure 14:
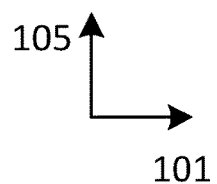

FIG. 14 illustrates the vacuum assembly 1200 in a schematic cross-sectional view 1400. The vacuum assembly 1200 may have a plurality of vacuum chambers 802k, e.g. may be provided by means of one or more than one chamber housing. Furthermore, the vacuum assembly 1200 may have a transfer device 112, which is configured to transfer a substrate through the plurality of vacuum chambers 802k along a transfer path 101t, 101k. The transfer device may have a plurality (e.g. more than 10, 50 or 100) of rotatably mounted transfer rollers 112, which define the transfer path 101*t*, 101*k*.

The transfer path 101*t*, 101*k* may have two sections, wherein cyclic transfer may take place along a first section 101*t*, and continuous transfer may take place along a second section 101*t*. For this purpose, the transfer device 112 may be configured to change the cyclic transfer 101*t* into continuous transfer 101*k*. The pace of the cyclic transfer may be obtained from the repeated cycle in accordance with which the substrate is introduced. The cycle may include: introducing a substrate into a vacuum chamber 802*k* through a first substrate transfer gap 202*s*, closing the first substrate transfer gap 202*s* by means of rotation of a first valve flap 204, pumping out the vacuum chamber 802*k* to give a vacuum, wherein the substrate is arranged in the vacuum chamber 802*k* during the pumping process, opening a second substrate transfer gap 202*s* by means of rotation of a second valve flap 204; and removing 101*k* the substrate from the vacuum chamber 802*k* through the second substrate transfer gap 202*s*; closing the second substrate transfer gap 202*s* by means of rotation of the second valve flap 204; and admitting air to the vacuum chamber 802*k*. The continuous transfer may include transferring the substrate through a plurality of vacuum chambers 802*k*, which are held under a vacuum during the transfer (e.g. medium vacuum or high vacuum). Air admission and/or pumping out may include changing a pressure in the vacuum chamber 802*k* by at least one order of magnitude.

For example, the continuous transfer may take place through a vacuum chamber 802*k* which is configured as a processing chamber, thus enabling the substrate to be processed. Processing may be accomplished by means of a processing device in the processing chamber, e.g. a coating device.

The or each chamber housing may be coupled to a pump assembly 804, e.g. a vacuum pump assembly, (e.g. in a gas-conveying manner) in order, for example, to provide a reduced pressure or a vacuum (vacuum housing), and may be of sufficiently robust design to withstand the action of the air pressure in the evacuated state. The pump assembly 804 (having at least one vacuum pump, e.g. a high vacuum pump, e.g. a turbo molecular pump) may make it possible to pump out some of the gas from the interior of the processing chamber, e.g. from the processing space.

According to various aspects of the disclosure, a chamber housing, e.g. a vacuum chamber provided therein, may be configured in such a way that a pressure in a range of approximately 10 mbar to approximately 1 mbar (in other words a low vacuum) may be provided therein, and/or a pressure in a range of approximately 1 mbar to approximately $10^{-3}$ mbar (in other words a medium vacuum), and/or a pressure in a range of approximately $10^{-3}$ mbar to approximately $10^{-7}$ mbar (in other words a high vacuum) and/or a pressure of less than a high vacuum, e.g. less than approximately $10^{-7}$ mbar.

According to various aspects of the disclosure, the substrate may include or be formed from at least one of the following: a ceramic, a glass, a semiconductor (e.g. amorphous polycrystalline or monocrystalline semiconductor, such as silicon), a metal and/or a polymer (e.g. plastic). For example, the substrate may be a wafer (a semiconductor substrate), a metal sheet or a sheet of glass, and may optionally be coated.

According to various aspects of the disclosure, processing of the substrate may include at least one of the following: cleaning the substrate, coating the substrate, irradiating the substrate (e.g. by means of light, UV light, particles, electrons, ions etc.), modifying the surface of the substrate, heating the substrate, etching the substrate and subjecting the substrate to a glow discharge.

In the present case, the operation of the valve flap 204 for the introduction of the substrate has been described.

Alternatively or additionally, the valve flap 204 may provide the function of a maintenance flap. For example, air is admitted to the vacuum region 1412 between the valve flaps 204 (when the latter are in the closed position), while the vacuum regions 1414 outside the valve flaps 204 are under a vacuum. The chamber housing may thus be opened, with the result that the vacuum region 1412 is exposed, and maintenance work in the ventilated vacuum region 1412 between the valve flaps 204 may be performed. The maintenance flap function is double acting, and may be supplied with differential pressure in one direction in each case, for example. Thus, air may be admitted to the section of the installation to the left of the valve flap by rotating the valve flap 204 to the right, and, similarly, air may be admitted to the section of the installation to the right of the valve flap by rotating the valve flap to the left. Thus, any number of installation sections, in any combination, may be separated from one another by the valve assembly 204.

Figure 15A:
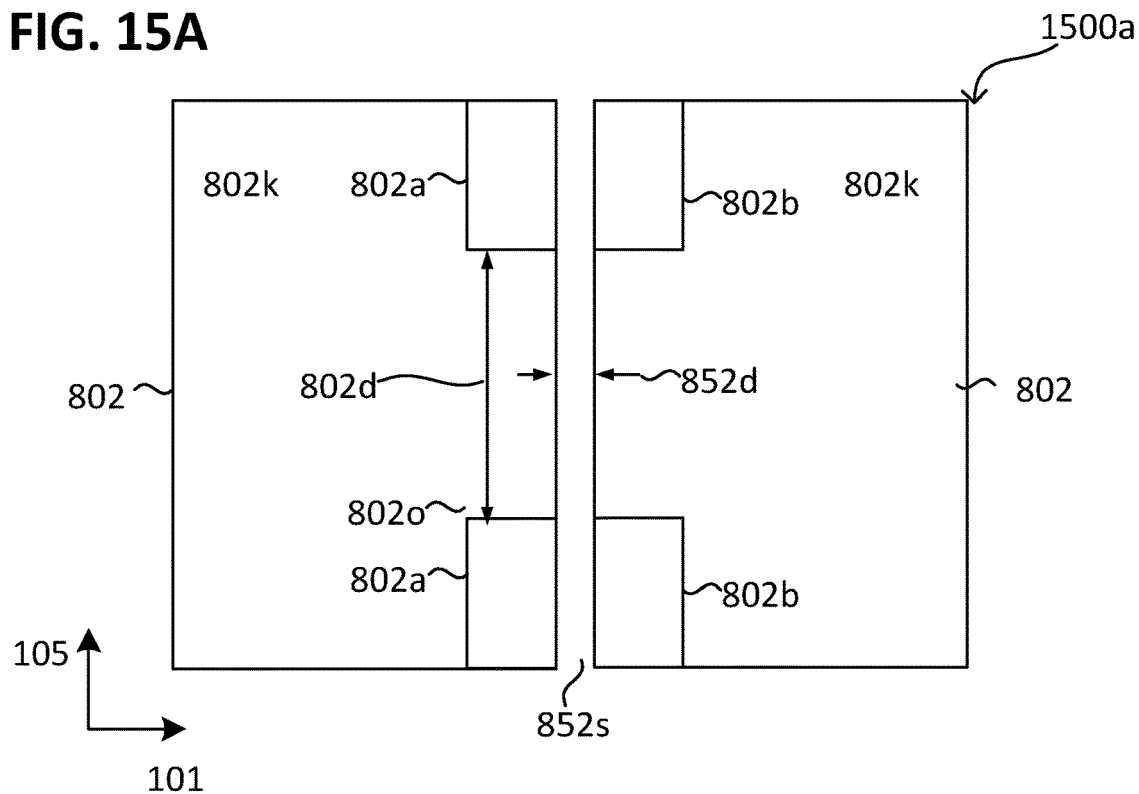
FIGS. 15A and 15B each show a vacuum assembly according to various aspects of the disclosure in a method.
Figure 15B:
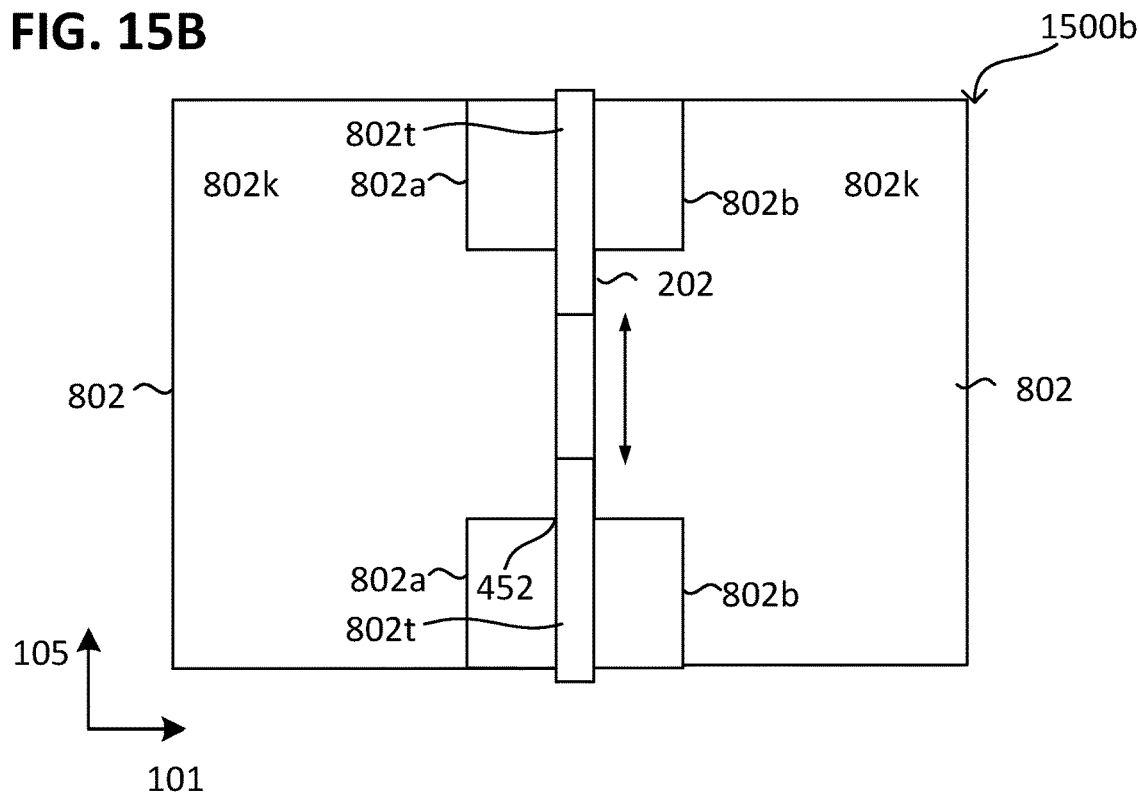

FIG. 15A and FIG. 15B illustrate the vacuum assembly (e.g. the vacuum assembly 1200) from FIG. 4C in a method 1500. The or each of the two chamber walls 802*a*, 802*b* may include the substrate transfer opening extending through each of the two chamber walls 802*a*, 802*b* along the transfer direction 101 by.

The method may include exchanging the valve assembly 100 for a flange plate without a valve flap. In 1500*a*, a valve assembly may be removed from a gap 852*s* between two vacuum chambers 802*k*. In 1500*n*, a flange plate may be inserted into the gap 852*s*. The flange plate may be a placeholder, which does not have a valve flap, a shaft and/or a bearing assembly, for example. The gap 852*s* may have an extent 852*d* (equal to the distance 852*d* between the two vacuum chambers 802*k*) of less than approximately 10 cm (centimeters), e.g. than approximately 8 cm (or 5 cm), e.g. than approximately 4 cm (or 3 cm). Alternatively or additionally, the gap 852*s* may have an extent 852*d* (also referred to as gap extent 852*d*) which is less than the height 802*d* of the substrate transfer opening of the first and/or second chamber wall 802*a*, 802*b*. The height 802*d* may be transverse to the direction of the gap extent 852*d* and/or transverse to the transfer direction 101. Similarly, the gap extent 852*d* may be less than a height of the substrate transfer opening 202*s*.

Various examples referring to what has been described above and illustrated in the figures are described below.

Example 1 is a valve assembly for a vacuum chamber housing (also referred to as a vacuum valve assembly), the valve assembly having: a valve housing, which has a substrate transfer gap; a valve flap, which is mounted so as to be rotatable about an axis of rotation, allowing it to be rotated into a first position and into a second position, wherein the axis of rotation is arranged in the substrate transfer gap and wherein the substrate transfer gap is extended longitudinally along the axis of rotation; wherein the valve flap closes the substrate transfer gap in the first position (being arranged at least partially in the substrate transfer gap, for example) and does not close it in the second position (being arranged adjacent to (e.g. below or above) the substrate transfer gap, for example).

Example 2 is the valve assembly according to example 1, wherein the valve housing has a coupling structure which extends at least on mutually opposite sides of the valve housing (e.g. encircling) between which the substrate transfer gap is arranged.

Example 3 is the valve assembly according to example 2, wherein, on the mutually opposite sides between which the substrate transfer gap is arranged, the coupling structure has a longitudinally extended groove for receiving a wall element (e.g. a chamber wall or a flange wall of the coupling structure).

Example 4 is the valve assembly according to one of examples 1 to 3, wherein the valve flap is extended through the substrate transfer gap in the first position.

Example 5 is the valve assembly according to one of examples 1 to 4, wherein the valve housing has a first recess, which is adjoined by the substrate transfer gap, wherein the valve flap engages in the first recess in the first position, and is at a distance from the first recess in the second position.

Example 6 is the valve assembly according to example 5, wherein, within the recess, the valve housing has a first sealing structure on a side facing the axis of rotation, wherein the first sealing structure has a groove for receiving a seal or a concavely curved sealing surface, for example.

Example 7 is the valve assembly according to one of examples 1 to 6, wherein the valve flap has one or more than one second sealing structure on a side facing away from the axis of rotation, wherein the second sealing structure has a groove for receiving a seal or a convexly curved sealing surface, for example.

Example 8 is the valve assembly according to one of examples 1 to 7, wherein the valve housing has a second recess, which is adjoined by the substrate transfer gap, wherein the valve flap is arranged in the second recess in the second position, and projects out of the second recess into the substrate transfer gap in the first position.

Example 9 is the valve assembly according to example 8, wherein the valve housing has a lubricant chamber adjoining the second recess, wherein the valve flap covers the lubricant chamber in the first position and exposes the lubricant chamber in the second position, wherein a lubricant is arranged in the lubricant chamber, for example.

Example 10 is the valve assembly according to one of examples 1 to 9, wherein the valve flap may be rotated into a third position, in which said flap closes the substrate transfer gap, wherein, in the second position, the valve flap is arranged between the first position and the third position, for example, wherein the third position is a mirror image of the first position in relation to the axis of rotation, for example.

Example 11 is the valve assembly according to example 10, wherein the third position and the first position are at a distance from one another and/or are arranged on mutually opposite sides of the axis of rotation.

Example 12 is the valve assembly according to one of examples 1 to 11, furthermore having: a sensor assembly that has one or more than one of the following sensors: a substrate sensor (e.g. motion sensor and/or glass sensor) for detecting a substrate in the substrate transfer gap, a position sensor for detecting a position of the valve flap; a temperature sensor for detecting a temperature of the substrate.

Example 13 is the valve assembly according to one of examples 1 to 12, wherein the valve flap has a first radiation shielding, which faces the axis of rotation.

Example 14 is the valve assembly according to one of examples 1 to 13, wherein the valve housing has a second radiation shielding, which delimits the substrate transfer gap.

Example 15 is the valve assembly according to one of examples 1 to 14, furthermore having: an elastomer seal that makes physical contact with the valve flap and the valve housing (e.g. the upper side thereof) when the valve flap is in the first position and/or third position.

Example 16 is the valve assembly according to one of examples 1 to 15, wherein the valve housing has two first fluid connections (e.g. water connections) and includes a first fluid line (e.g. water line), which extends through the valve housing and/or connects the two first fluid connections to one another in a fluid-conveying manner.

Example 17 is the valve assembly according to one of examples 1 to 16, wherein the valve flap has two second fluid connections (e.g. water connections) and includes a second fluid line (e.g. water line), which extends through the valve flap and/or connects the two second fluid connections to one another in a fluid-conveying manner.

Example 18 is the valve assembly according to one of examples 1 to 17, furthermore having: a gas feed system that has one or more than one gas outlet directed into the substrate transfer gap.

Example 19 is the valve assembly according to one of examples 1 to 18, wherein the valve housing has at least one third fluid connection (e.g. gas connection) and a fluid outlet opening (e.g. gas outlet) and includes a third fluid line (e.g. gas line), which extends through the valve housing and/or connects the fluid connection to the fluid outlet opening in a fluid-conveying manner, wherein the fluid outlet opening is directed at the substrate transfer gap.

Example 20 is the valve assembly according to one of examples 1 to 19, wherein, for example, the substrate transfer gap extends through the valve housing along one direction (also referred to as the transfer direction), wherein the substrate transfer gap has a first extent of more than 5 cm, for example, wherein the first extent is transverse to the axis of rotation and transverse to the transfer direction; wherein the substrate transfer gap has a second extent of more than 1 m, for example, wherein the second extent is along the axis of rotation.

Example 21 is the valve assembly according to one of examples 1 to 20, wherein the substrate transfer gap has an aspect ratio of more than 10.

Example 22 is the valve assembly according to one of examples 1 to 21, wherein the valve flap has a flat side, which faces the axis of rotation (in the first position and/or the second position, for example); and/or wherein the valve flap has a curved side, which faces away from the axis of rotation (in the first position and/or the second position, for example); wherein, on the curved side, the valve flap has a boundary surface that forms part of a rotation surface relative to the axis of rotation, for example.

Example 23 is a vacuum assembly having: a chamber wall that has a through opening (the through opening extending through the chamber wall, for example, e.g. in the direction of the transfer direction), a valve assembly according to one of examples 1 to 22, which is arranged in the through opening or is at least extended into said opening and is connected (e.g. coupled) to the chamber wall; an optional transfer device for transferring a substrate through the substrate transfer gap.

Example 24 is a vacuum assembly according to example 23, furthermore having: a first vacuum chamber housing, which has the chamber wall, wherein the valve assembly and/or the transfer device are arranged in the vacuum chamber housing, for example; the vacuum assembly optionally furthermore having: a second vacuum chamber housing, which has an additional chamber wall, wherein the valve assembly has, for example, a flange wall which is arranged between the chamber wall and the additional chamber wall (and is coupled to both and/or protrudes beyond the two vacuum chamber housings, for example), wherein the flange wall has a supply structure, for example, for supplying the valve assembly, wherein a distance between the first vacuum chamber housing and the second vacuum chamber housing is less than 10 cm and/or less than an extent of the through opening, for example, wherein the extent of the through opening is transverse to the axis of rotation and transverse to a direction (also referred to as a transfer direction) along which the through opening extends through the chamber wall.

Example 25 is a method (e.g. for operating the valve assembly according to one of examples 1 to 22) including: moving a valve flap between a first position and a second position, wherein the movement includes rotating the valve flap about an axis of rotation which is arranged within a substrate transfer gap, wherein the valve flap closes the substrate transfer gap in the first position (being arranged at least partially in the substrate transfer gap, for example) and does not close the substrate transfer gap in the second position (being arranged adjacent to the substrate transfer gap, for example); and transferring a substrate through the substrate transfer gap when the valve flap is in the second position; wherein a vacuum is formed in the substrate transfer gap, for example.

Example 26 is a method for a vacuum assembly that has two vacuum chambers, the method including: removing a valve assembly (which has a valve flap, for example, e.g. the valve assembly according to one of examples 1 to 22) from a gap between the two vacuum chambers; inserting a flange plate into the gap, wherein the flange plate seals the gap in a vacuum-tight manner; transferring a substrate between the two vacuum chambers through a substrate transfer opening in the flange plate, wherein, in a first state (of the vacuum assembly), in which the flange plate is arranged in the gap, the vacuum assembly has fewer valve flaps than in a second state (of the vacuum assembly), in which the valve assembly is arranged in the gap; wherein furthermore, for example, formation of a vacuum may take place in the two vacuum chambers (e.g. in the first state and/or the second state).

Example 27 is a method for a vacuum assembly that has two or more vacuum chambers, the method including: transferring the vacuum assembly between a first state of the vacuum assembly and a second state of the vacuum assembly; wherein, in the first state, a valve assembly (which has a valve flap, for example, e.g. the valve assembly according to one of examples 1 to 22) is arranged in a gap between the two vacuum chambers, wherein a flange plate is arranged in the gap in the second state, wherein, in the first state (of the vacuum assembly), the vacuum assembly has fewer valve flaps than in the second state (of the vacuum assembly), transferring a substrate between the two vacuum chambers through a substrate transfer opening in the flange plate and/or in the vacuum assembly, wherein furthermore, for example, formation of a vacuum may take place in the two vacuum chambers (e.g. in the first state and/or the second state).

Example 28 is a method for a vacuum assembly that has two or more vacuum chambers (of which each vacuum chamber has, for example, a through opening, the through openings being in alignment with one another, for example), the method including: forming a gap between the two vacuum chambers by moving them relative to one another (e.g. away from one another) (i.e. it is possible for just one of the vacuum chambers or both of the vacuum chambers to be moved); inserting a valve assembly (which has a valve flap, for example, e.g. the valve assembly according to one of examples 1 to 22) into the gap between the two vacuum chambers, wherein the valve assembly seals the gap in a vacuum-tight manner; wherein, for example, the vacuum assembly has fewer valve flaps before the formation of the gap than in a state in which the valve assembly is arranged in the gap; wherein, for example, the two vacuum chambers are in physical contact with one another before the formation of the gap, form a common vacuum system, and/or are sealed off from one another; wherein a distance between the two vacuum chambers (when the gap has been formed) is less than 10 cm, less than an extent of the through opening and/or less than twice the extent of the substrate transfer gap, for example, wherein, for example, the extent (of the substrate transfer gap and/or of the through opening) is transverse to an axis of rotation of the valve assembly and furthermore transverse to a direction along which the substrate transfer gap extends through the valve assembly, wherein, for example, the valve assembly has a flange wall which is arranged between the two vacuum chambers; wherein, for example, the valve assembly is arranged in the through opening and/or extends at least partially through said opening into one or both of the two vacuum chambers; the method may optionally furthermore include: admitting air to the two vacuum chambers before the formation of the gap; the method may furthermore optionally include: transferring a substrate between the two vacuum chambers through a substrate transfer gap of the valve assembly.

What is claimed is:

1. A valve assembly configured to connect to a vacuum chamber, the valve assembly comprising:
    a valve housing, which comprises a substrate transfer gap; and
    a valve flap mounted rotatably about an axis of rotation that allows the valve flap to be rotated along a curved interface between the valve flap and the valve housing into a first rotational position about the axis of rotation, a second rotational position about the axis of rotation, and a third rotational position about the axis of rotation, wherein the axis of rotation is disposed in the substrate transfer gap, wherein the substrate transfer gap extends longitudinally along the axis of rotation,
    wherein the valve flap closes the substrate transfer gap along the curved interface in the first rotational position and in the third rotational position, and does not close the substrate transfer gap in the second rotational position, wherein the first rotational position is rotationally opposite to the third rotational position along the curved interface.

2. The valve assembly according to claim 1, wherein the valve housing comprises a coupling structure which extends at least between opposite sides of the valve housing, wherein the substrate transfer gap is between the opposite sides of the valve housing.

3. The valve assembly according to claim 1, wherein the curved interface comprises a first curved interface on one side of the substrate transfer gap and a second curved interface on an opposite side of the substrate transfer gap, wherein the valve flap, in the first rotational position, extends across the substrate transfer gap between the first curved interface and the second curved interface.

4. The valve assembly according to claim 1, wherein the valve housing comprises a first curved recess, which adjoins the substrate transfer gap, wherein the valve flap comprises a corresponding curved surface that corresponds to the first curved recess, wherein the curved interface comprises a first curved interface formed between the first curved recess and the corresponding curved surface when the valve flap is in the first rotational position.

5. The valve assembly according to claim 4, wherein the valve housing comprises a second curved recess, which adjoins the substrate transfer gap, wherein the curved interface further comprises a second curved interface that also corresponds to the corresponding curved surface, wherein the second curved interface is formed between the second curved recess and the corresponding curved surface when the valve flap is in the second rotational position.

6. The valve assembly according to claim 5, wherein the valve housing comprises a lubricant chamber adjoining the second curved recess, wherein the valve flap covers the lubricant chamber in the first rotational position and exposes the lubricant chamber in the second rotational position.

7. The valve assembly according to claim 1, wherein in the second rotational position, the valve flap is disposed between the first rotational position and the third rotational position.

8. The valve assembly according to claim 1, wherein the valve flap comprises a first radiation shielding comprising a layer stack of an insulation layer and a reflecting radiation layer, wherein the reflecting radiation layer faces the axis of rotation.

9. The valve assembly according to claim 1, wherein the valve housing comprises two fluid connections and a fluid line, which connects the two fluid connections to one another.

10. The valve assembly according to claim 1, wherein the valve housing comprises an additional fluid connection, an additional fluid outlet opening, and an additional fluid line that connects the additional fluid connection to the additional fluid outlet opening, wherein the additional fluid outlet opening is directed towards the substrate transfer gap.

11. A vacuum assembly, comprising: a chamber wall of a vacuum chamber, which comprises a through opening extending through the chamber wall; and a valve assembly according to claim 1, which extends into the through opening and is connected to the chamber wall.

12. The vacuum assembly according to claim 11, furthermore having:
a first vacuum chamber housing, which comprises the chamber wall; and
a second vacuum chamber housing, which comprises an additional chamber wall,
wherein a distance between the chamber wall and the additional chamber wall is less than 10 cm and/or than an extent of the through opening,
wherein the valve assembly comprises a flange wall which is disposed between the chamber wall and the additional chamber wall,
wherein the extent of the through opening is transverse to the axis of rotation and furthermore transverse to a direction along which the through opening extends through the chamber wall.

13. The valve assembly according to claim 1, wherein the valve flap further comprises a seal configured to sealably contact the valve housing at the curved interface.

14. The valve assembly according to claim 13, wherein the seal contacts the valve housing along a curved interface during at least part of a rotation of the valve flap from the first rotational position and into the second rotational position.

15. The valve assembly according to claim 1, wherein the curved interface comprises a first curved interface on one side of the substrate transfer gap and a second curved interface on an opposite side of the substrate transfer gap, wherein the valve flap further comprises a first seal and a second seal, wherein the valve flap, in the first rotational position, extends across the substrate transfer gap between the first curved interface and the second curved interface so that the first seal sealably contacts the valve housing at the first curved interface and the second seal sealably contacts the valve housing at the second curved interface.

16. The valve assembly according to claim 1, wherein the valve housing comprises a first recess and a second recess, wherein the first recess is configured to positively engage the valve flap to stop rotation of the valve flap in a first rotational direction about the axis of rotation, wherein the second recess is configured to positively engage the valve flap to stop rotation of the valve flap in a second rotational direction that is counter to the first rotational direction.

17. The valve assembly according to claim 16, wherein the first recess positively engages the valve flap in the first rotational position and wherein the second recess positively engages the valve flap in the second rotational position.

18. The valve assembly according to claim 1, wherein the valve housing comprises a groove configured to receive a wall of a vacuum chamber housing of the vacuum chamber.

19. A valve assembly for a vacuum chamber housing, the valve assembly comprising:
a valve housing, which comprises a substrate transfer gap; and
a valve flap mounted rotatably about an axis of rotation that allows the valve flap to be rotated along a curved interface between the valve flap and the valve housing into a first position, a second position, and a third position, wherein the axis of rotation is disposed in the substrate transfer gap, wherein the substrate transfer gap extends longitudinally along the axis of rotation,
wherein the valve flap closes the substrate transfer gap along the curved interface in the first position and in the third position, and does not close the substrate transfer gap in the second position,
wherein the first position is located opposite to the third position along the curved interface,
wherein the valve flap comprises a first radiation shielding comprising a layer stack of an insulation layer and a reflecting radiation layer, wherein the reflecting radiation layer faces the axis of rotation.

* * * * *